United States Patent
Moriwaka

(10) Patent No.: US 7,879,689 B2
(45) Date of Patent: Feb. 1, 2011

(54) METHOD OF MANUFACTURING A SEMICONDUCTOR DEVICE INCLUDING A SEMICONDUCTOR SUBSTRATE WITH STRIPES OF DIFFERENT CRYSTAL PLANE DIRECTIONS

(75) Inventor: Tomoaki Moriwaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 4 days.

(21) Appl. No.: 12/273,010

(22) Filed: Nov. 18, 2008

(65) Prior Publication Data
US 2009/0127591 A1    May 21, 2009

(30) Foreign Application Priority Data
Nov. 19, 2007    (JP)    ............................. 2007-298799

(51) Int. Cl.
*H01L 21/301* (2006.01)
*H01L 21/461* (2006.01)
*H01L 21/84* (2006.01)
*H01L 27/12* (2006.01)

(52) U.S. Cl. ................... 438/458; 257/255; 257/E21.7; 257/E21.568; 257/E21.561; 438/455; 438/150

(58) Field of Classification Search ................. 438/455, 438/458, 459, 973
See application file for complete search history.

(56) References Cited

U.S. PATENT DOCUMENTS

| 5,105,254 A * | 4/1992 | Terao ......................... 257/49 |
| 2007/0134891 A1* | 6/2007 | Adetutu et al. .............. 438/464 |

* cited by examiner

*Primary Examiner*—Marcos D Pizarro
*Assistant Examiner*—Raj Gupta
(74) *Attorney, Agent, or Firm*—Eric J. Robinson; Robinson Intellectual Property Law Office, P.C.

(57) ABSTRACT

Manufacturing a semiconductor device with higher operating characteristics and achieve low power consumption of a semiconductor integrated circuit. A single crystal semiconductor layer is formed so that crystal plane directions of single crystal semiconductor layers which are used for channel regions of an n-channel TFT and a p-channel TFT and which are formed over the same plane of the substrate are the most appropriate crystal plane directions for each TFT. In accordance with such a structure, mobility of carrier flowing through a channel is increased and the semiconductor device with higher operating characteristics can be provided. Low voltage driving can be performed, and low power consumption can be achieved.

11 Claims, 19 Drawing Sheets

METHOD OF MANUFACTURING A SEMICONDUCTOR DEVICE INCLUDING A SEMICONDUCTOR SUBSTRATE WITH STRIPES OF DIFFERENT CRYSTAL PLANE DIRECTIONS

BACKGROUND OF THE INVENTION

1. Field of the Invention

The present invention relates to a semiconductor substrate including a so-called SOI (silicon on insulator) structure in which a semiconductor layer is provided over an insulating surface, semiconductor device, and a manufacturing method thereof.

2. Description of the Related Art

An integrated circuit which uses a semiconductor substrate called a silicon-on-insulator (hereinafter, also referred to as an SOI) that has a thin single crystal semiconductor layer provided on an insulating surface has been developed, instead of an integrated circuit which uses a silicon wafer manufactured by thinly slicing an ingot of a single crystal semiconductor. The integrated circuit using an SOI substrate has been attracting attention as an integrated circuit which reduces parasitic capacitance between a drain of the transistor and the substrate and improves the performance of a semiconductor integrated circuit.

There are various manufacturing methods of an SOI substrate, but an SOI substrate formed by a method called Smart-Cut™ is known as an SOI substrate with both quality of an SOI layer and easiness in production (throughput). This SOI substrate is formed in the following manner; hydrogen ions are implanted to a bond wafer formed of a silicon layer, and the bond wafer is bonded to another wafer (base wafer) at room temperature. Here, a strong bond can be formed by van der Waals' forces at room temperature. As a result, the bond wafer bonded with the base wafer is separated using a layer, in which hydrogen ions are implanted, as a boundary by heat treatment at a temperature of about 500° C.

Further, a method of forming a single crystal silicon thin film over a crystallized glass which is high heat resistant glass by utilizing Smart Cut (registered trademark) is known (see Patent Document 1: Japanese Published Patent Application No. H11-163363).

SUMMARY OF THE INVENTION

When an integrated circuit in which a CMOSFET is provided over a SOI substrate is manufactured, it is needed to manufacture an n-channel thin film transistor (hereinafter, referred to as a TFT) whose channel portion is formed of a semiconductor having n-type conductivity and a p-channel TFT whose channel portion is formed of a semiconductor having p-type conductivity using the same substrate. Moreover, a crystal plane direction of a channel formation region is important to increase operating characteristics of each TFT. In the case of an n-channel TFT, a crystal plane direction with which mobility of electrons as carriers is the highest is a {100} plane. In the case of a p-channel TFT, a crystal plane direction with which mobility of holes as carriers is the highest is a {110} plane. That is, the most appropriate crystal plane direction of a channel formation region in the n-channel TFT and the most appropriate crystal plane direction of a channel formation region in the p-channel TFT are different.

In contrast, in an SOI substrate formed of one single crystal semiconductor substrate using an ion implantation separation method, a crystal plane direction of a single crystal semiconductor of the SOI layer is limited to one direction. For example, the plane direction of a SOI layer formed of a semiconductor substrate having a {100} direction is the {100} direction throughout the SOI layer. Therefore, when a CMOS circuit is manufactured using the SOI layer formed by an ion implantation separation method, since a channel formation region of each TFT cannot be formed of a single crystal semiconductor film having the most appropriate crystal plane direction, there is a problem in that it is difficult to increase operation characteristics of the circuit.

The present invention is made in view of the above-described problem. A semiconductor layer is formed so that each crystal plane direction of single crystal semiconductor layers to be channel formation regions of an n-channel TFT and a p-channel TFT which are formed over the same substrate is the most appropriate crystal plane direction for each TFT.

A typical structure of the present invention is described below. A circular single crystal semiconductor substrate is processed to have a quadrangular shape and two kinds of a plurality of single crystal semiconductor substrates are formed. In this case, the two kinds of a plurality of single crystal semiconductor substrates are formed so that each side surface thereof has a different crystal plane direction. For example, the crystal plane direction of a side surface of one substrate is {100} and that of a side surface of the other substrate is {110}. After an insulating film is formed on each surface of the two kinds of the quadrangular single crystal semiconductor substrates, the two kinds of a plurality of quadrangular single crystal semiconductor substrates are alternately superposed and bonded to each other with the insulating films interposed therebetween to manufacture a semiconductor ingot having a quadrangular prism shape. That is, four side surfaces out of six side surfaces included in the semiconductor ingot having a quadrangular prism shape are single crystal semiconductor surfaces. In the single crystal semiconductor surfaces, semiconductor layers having a first crystal plane direction and semiconductor layers having a second crystal plane direction are alternately arranged in stripe. The semiconductor ingot is thinly sliced parallel to the single crystal semiconductor surface on which the semiconductor layer having the first crystal plane direction and the semiconductor layer having the second crystal plane direction are alternately arranged in stripe, and a surface thereof is polished by CMP (chemical mechanical polishing) or the like, whereby a quadrangular semiconductor substrate whose surface is formed with the semiconductor layer having the first crystal plane direction and the semiconductor layer having the second crystal plane direction arranged alternately in stripe is formed.

Next, an insulating film is formed on the surface of the quadrangular semiconductor substrate in which the semiconductor layer having the first crystal plane direction and the semiconductor layer having the second crystal plane direction are alternately arranged in stripe. Then hydrogen ions or the like are added to a region at a predetermined depth from the surface of the substrate to form an embrittlement layer. A bonding layer is formed over the insulating film, and an insulating substrate and the bonding layer are bonded to each other. When the insulating substrate and the bonding layer are bonded to each other and heat treatment is performed, a crack is generated in the emibrittlement layer and the quadrangular semiconductor substrate is separated, whereby over the insulating substrate, a semiconductor film is formed, in which the semiconductor layer having the first crystal plane direction and the semiconductor layer having the second crystal plane direction are alternately arranged in stripe.

The present invention makes it possible to form the semiconductor layer having different crystal plane directions over the insulating substrate. In addition, the above-described process makes it possible to form the semiconductor substrate having different crystal plane directions over the surface of the substrate. Accordingly, selection of an appropriate crystal plane direction for each channel formation region of an n-channel TFT and a p-channel TFT can be made and improvement of field effect mobility of each TFT, that is, manufacturing a semiconductor device with higher operating characteristics can be realized. Further, low voltage driving can be performed, and low power consumption of a semiconductor integrated circuit can be achieved.

According to the present invention, since the semiconductor thin layer having different crystal plane directions on the insulating substrate can be formed by single separation heat treatment, a process for manufacturing the semiconductor layer can be simplified.

DETAILED DESCRIPTION OF THE INVENTION

Figure 1A:
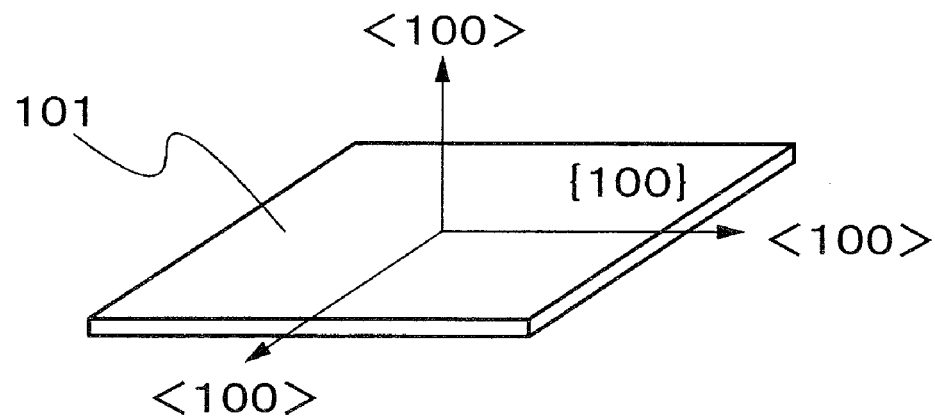
FIGS. 1A and 1B are perspective views illustrating examples of quadrangular semiconductor substrates.

Hereinafter, the embodiment modes of the present invention will be described with reference to the drawings. Note that, the present invention is not limited to the following description, and it is easily understood by those skilled in the art that various changes may be made in forms and details without departing from the spirit and the scope of the present invention. Therefore, the present invention is not to be construed as being limited to the following description of the embodiment modes. Note that, in structures of the present invention described below, reference numerals denoting the same or corresponding elements are used commonly in the drawings.

Embodiment Mode 1

Figure 1B:
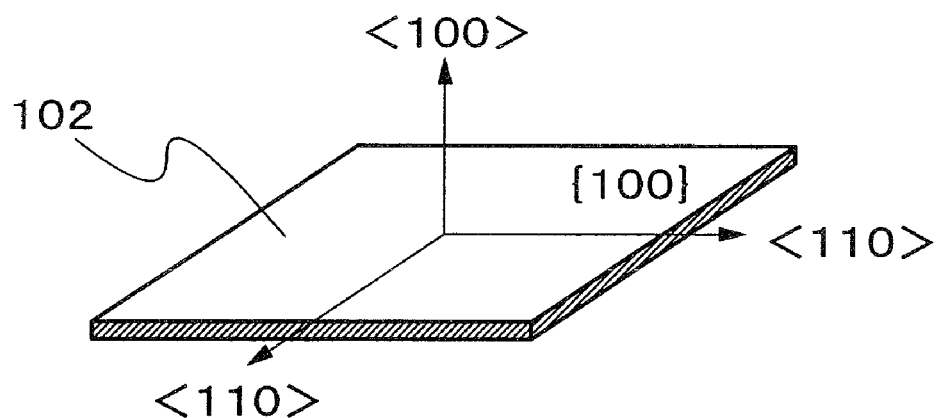

In this embodiment mode, a process for forming a single crystal semiconductor layer having different crystal plane directions over an insulating substrate will be described. First, a semiconductor substrate having n-type conductivity whose crystal plane direction is {100} is processed to have a quadrangular shape. At this time, a first semiconductor substrate 101 is formed so that the crystal plane direction of a side surface of the substrate is {100} (see FIG. 1A). In a similar manner, a semiconductor substrate having p-type conductivity whose crystal plane direction is {100} is processed to have a quadrangular shape. At this time, a second semiconductor substrate 102 is formed so that the crystal plane direction of a side surface of the substrate is {110} (see FIG. 1B). In this embodiment mode, a semiconductor substrate of silicon, gallium arsenide, indium phosphide, or the like can be used for the first semiconductor substrate 101 and the second semiconductor substrate 102.

Next, silicon oxide films 103 and 104 are formed over one surface of the first semiconductor substrate 101 and one surface of the second semiconductor substrate 102, respectively. The silicon oxide film is preferably formed by a chemical vapor deposition (CVD) method, a plasma CVD method, or the like, using, for example, a mixed gas of a TEOS gas and an oxygen gas to have a thickness greater than or equal to 10 nm and less than or equal to 800 nm.

Figure 2A:
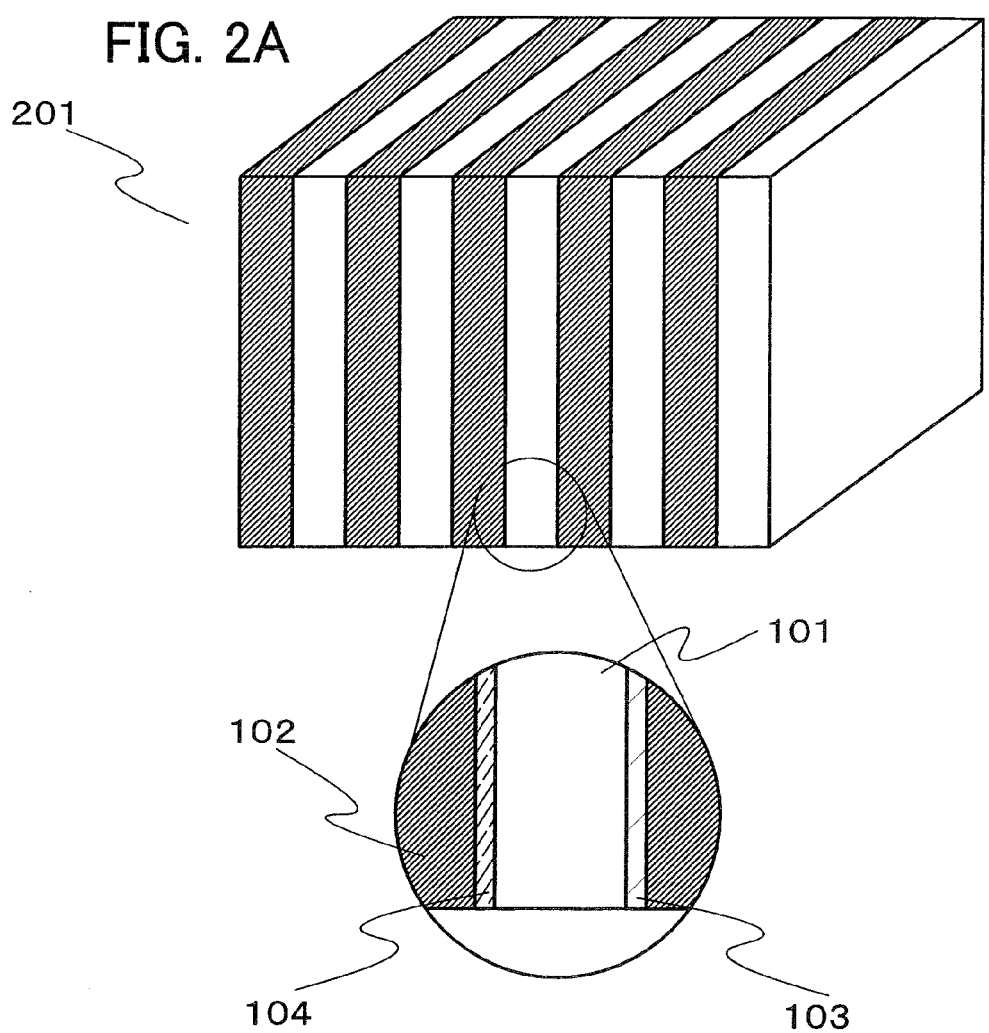
FIGS. 2A and 2B are views illustrating a process for manufacturing a semiconductor substrate.

Then, a plurality of the first semiconductor substrates 101 and a plurality of the second semiconductor substrates 102 are arranged alternately and bonded to each other, whereby a semiconductor ingot 201 having a quadrangular prism shape, which has a stacked-layer structure, is manufactured (see FIG. 2A). The silicon oxide film 103 formed over one surface of the first semiconductor substrate 101 is in close contact with a surface of the second semiconductor substrate 102, over which the silicon oxide film 104 is not formed, and the silicon oxide film 104 formed over one surface of the second semiconductor substrate 102 is in close contact with a surface of the first semiconductor substrate 101, over which the silicon oxide film 103 is not formed, whereby a bond is formed. This bond can be performed at room temperature. This bond is carried out at the atomic level, and a strong bond is formed at room temperature by van der Waals' forces. If necessary, the bond may be further strengthened by performing heat treatment on the semiconductor ingot 201. Further, the silicon oxide film 103 may be formed on both surface of the first semiconductor 101 and the silicon oxide film 104 may be formed on both surfaces of the second semiconductor substrate 102 to form the bond.

Accordingly, in four surfaces out of the six surfaces included in the semiconductor ingot 201, alternate stripes of different crystal plane directions appear. Note that a size of the semiconductor ingot 201 and the thickness of each layer in a stripes shape can be selected as appropriate in accordance with the diameter of a semiconductor substrate, the thickness of a semiconductor substrate, the number of semiconductor substrates to be superposed, and the like.

Note that in this embodiment mode, the semiconductor substrates are processed to have a quadrangular shape in advance and then the substrates are bonded to each other. However, the first and second semiconductor substrates in a circular shape may be arranged alternately and bonded to each other while displacing the substrate by 45° C. or 135° C. from the other substrate with the centers of the circular substrates used as a rotation axis. After that, the resulting substrates may be processed to have a quadrangular shape.

Figure 2B:
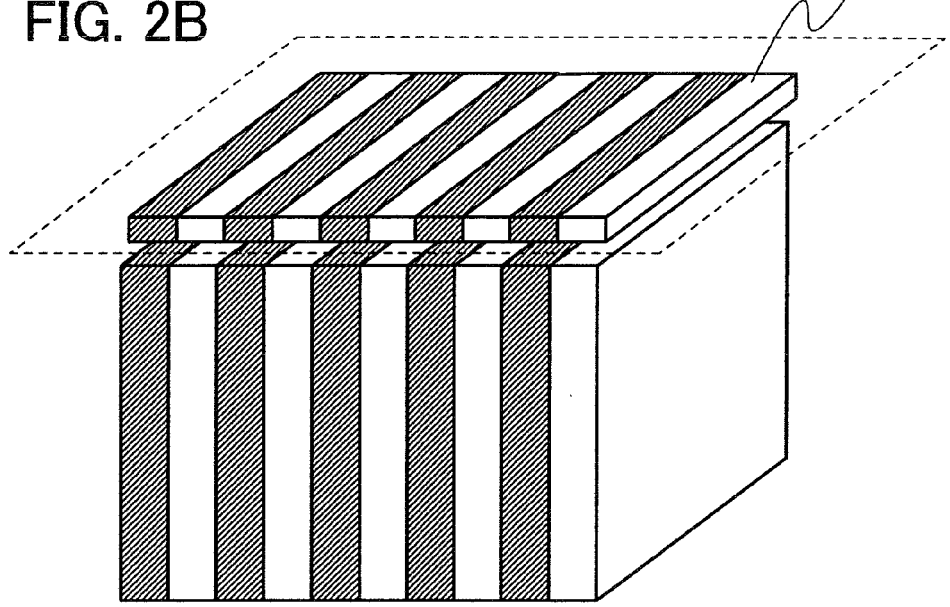

Considering a working property in separation heat treatment to be performed later, the semiconductor ingot 201 is thinly sliced parallel to a plane in which alternate stripes of different crystal plane directions appear, and the surface of the substrate is planarized by CMP or the like, whereby a quadrangular semiconductor substrate 202 is formed (see FIG. 2B). Through the above-described process, the semiconductor substrate, in which the plurality of first semiconductor layers having the first crystal plane direction and the plurality of second semiconductor layers having the second crystal plane direction which is different from the first crystal plane direction, are alternately arranged in stripe in the same plane with the plurality of insulating layers each interposed between the first semiconductor layer and the second semiconductor layer can be manufactured. Needless to say, later process can be performed on the semiconductor ingot without slicing.

Hereinafter, as shown in FIGS. 3A to 3D and 4, a process for forming a single crystal semiconductor layer over an insulating substrate 305 from the semiconductor substrate 202 will be described. Note that glass, quartz, sapphire, or the like can be used for the insulating substrate 305.

Figure 3A:
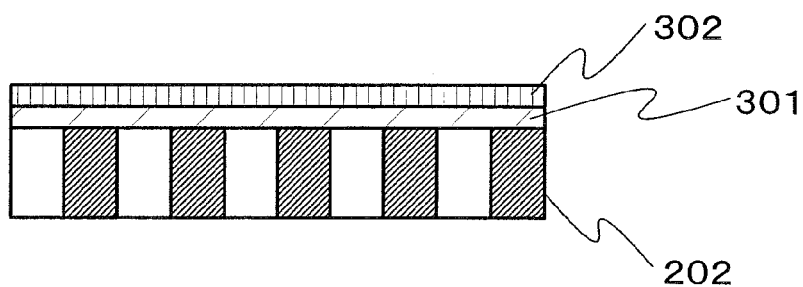
FIGS. 3A to 3D are views illustrating a process for transferring a single crystal semiconductor film to an insulating substrate.

First, a silicon oxynitride film 301 and a silicon nitride oxide film 302 are sequentially formed over the semiconductor substrate 202 (see FIG. 3A). Note that, in this specification, a silicon oxynitride film refers to a film that contains more oxygen atoms than nitrogen atoms and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film refers to a film that contains more nitrogen atoms than oxygen atoms and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %. Here, the silicon oxynitride film 301 and the silicon nitride oxide film 302 prevent the semiconductor substrate from being contaminated by an impurity such as metal in the following ion irradiation step for forming an emibrittlement layer, and serve as protective films for preventing a surface of the substrate from being damaged due to impact of irradiation with ions. As the protective film, an insulating film, such as a silicon oxide film, a silicon nitride film, a silicon oxynitride film, or a silicon nitride oxide, can be used as appropriate. The protective film is a stacked-layer film in this embodiment mode. Alternatively, a single film can be employed for the protective film.

Figure 3B:
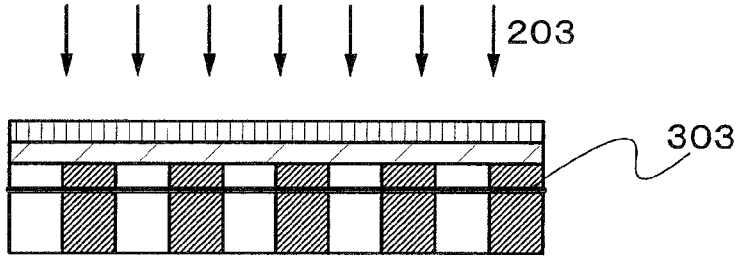

Next, the semiconductor substrate 202 is irradiated with an ion beam 203 accelerated by an electric field to form an emibrittlement layer 303 (see FIG. 3B). The thickness of a single crystal semiconductor film formed over the insulating substrate from the semiconductor substrate 202 is determined depending on the depth of a region where the emibrittlement layer 303 is formed. The thickness of the single crystal semiconductor layer is set to be 5 nm to 500 nm, preferably 10 nm to 200 nm. Note that the depth of the region where the emibrittlement layer 303 is formed can be controlled by the accelerating energy of the ion beam and the incidence angle of the ion beam.

A hydrogen gas, a rare gas, or the like can be used for a gas used in the irradiation of ions, and a hydrogen gas is preferably used in this embodiment mode. When a hydrogen gas is used, ion species generated are $H^+$, $H_2^+$, and $H_3^+$, and it is preferable that $H_3^+$ is the largest number of ions with which irradiation is performed. The addition efficiency of $H_3^+$ is higher than that of $H^+$ or $H_2^+$. Therefore, an irradiation time can be reduced. Further, a crack is easily generated at the emibrittlement layer in the following separation heat treatment.

Then, a bonding layer 304 is formed over the silicon nitride oxide film 302. It is preferable that the bonding layer have a bonding surface with smoothness and hydrophilic and that the bonding layer 304 be a silicon oxide film formed by a CVD method or the like. The thickness of the silicon oxide film is set to be 10 nm to 200 nm, preferably 20 nm to 50 nm.

Figure 3C:
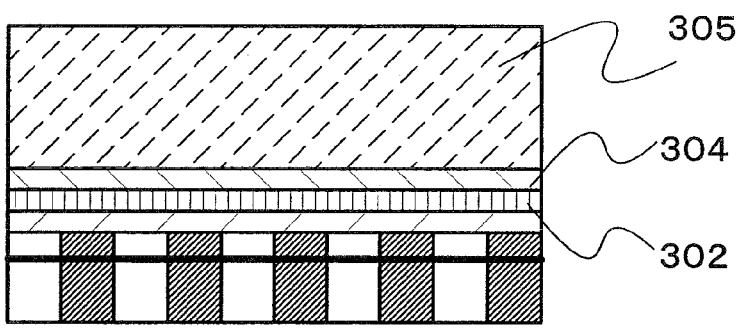
Figure 3D:
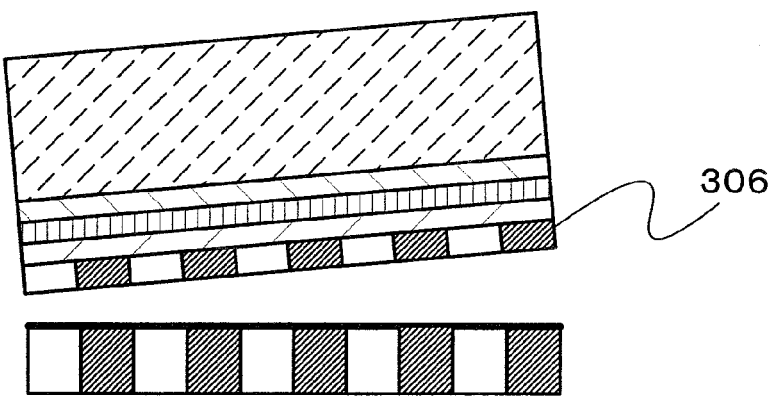

Next, a surface of the insulating substrate 305 and the bonding layer 304 formed over the semiconductor substrate 202 are cleaned by ultrasonic cleaning or the like and in contact with each other to perform a bond (see FIG. 3C). This bond is carried out at a room temperature by acting van der Waals' forces between the insulating substrate 305 and the bonding layer 304. At this time, a silicon oxide film may be formed between the insulating substrate 305 and the bonding layer 304 as a bonding layer on an insulating substrate side.

After the bond of the insulating substrate 305 and the semiconductor substrate 202 is formed, a semiconductor layer 306 is separated from the semiconductor substrate 202 by heat treatment at a temperature of 400° C. to 650° C. By this heat treatment a change occurs in the volume of microvoids formed in the emibrittlement layer 303, and a crack is generated to form a ruptured section along the emibrittlement layer. The semiconductor layer 306 can be separated along the ruptured section (see FIG. 3D). Further, since a bonding interface between the insulating substrate 305 and the semiconductor substrate 202 is heated by this heat treatment, a covalent bond which is stronger than a hydrogen bond is formed on the bonding interface, so that the bond is strengthened. In this manner, the semiconductor layer 306 having different crystal plane directions is formed over the insulating substrate 305. The semiconductor layer 306 is formed by gathering a plurality of first semiconductor layers 306a having a {110} plane and a plurality of second semiconductor layers 306b having a {100} plane. The first semiconductor layer 306a can be a channel formation region of a p-channel TFT and the second semiconductor layer 306b can be a channel formation region of an n-channel TFT.

In accordance with this embodiment mode, the semiconductor layer having different crystal plane directions over the insulating substrate can be formed in single separation heat treatment, whereby a process for manufacturing the semiconductor layer can be simplified. Further, an n-channel TFT is formed at a region whose crystal plane direction is {100} and a p-channel TFT is formed at a region whose crystal plane direction is {110}, whereby a semiconductor integrated circuit in which field effect mobility of the n-channel TFT and the p-channel TFT is increased can be provided.

Figure 4:
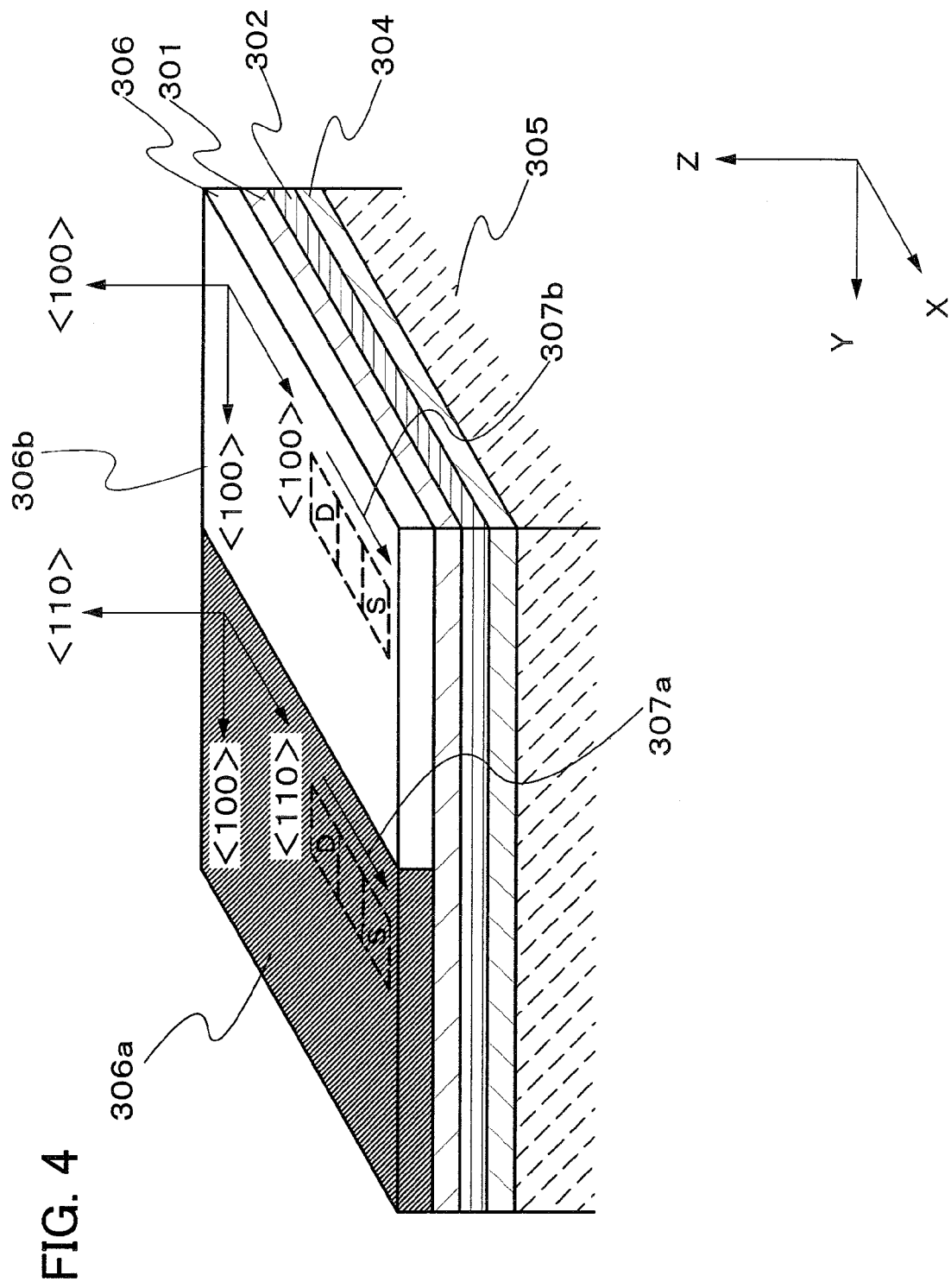
FIG. 4 is a view illustrating a forming direction of a transistor.
Figure 5A:
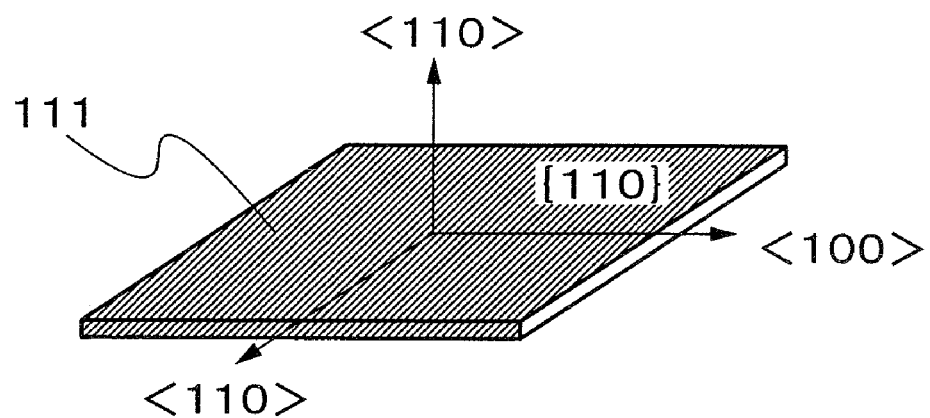
FIGS. 5A and 5B are perspective views illustrating examples of quadrangular semiconductor substrates.
Figure 5B:
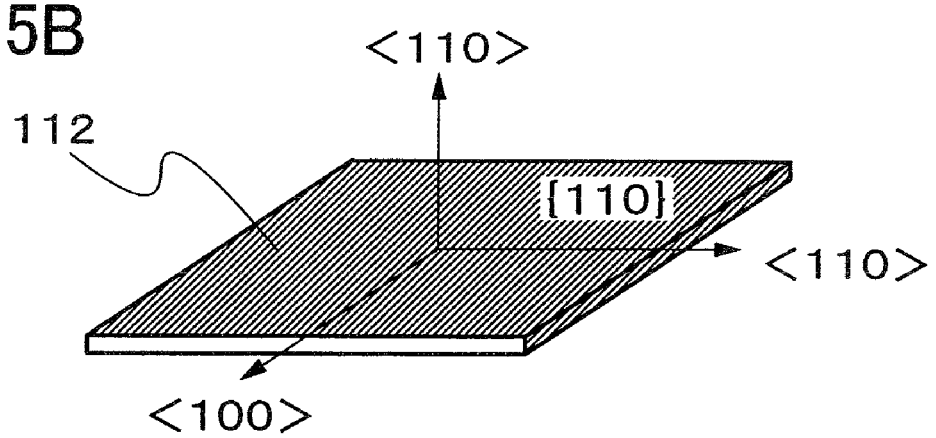

In addition, as illustrated in FIG. 4, a channel length direction 307a of the p-channel TFT is arranged to be parallel to a crystal axis <110> and a channel length direction 307b of the n-channel TFT is arranged to be parallel to a crystal axis <100>, whereby the operating performance of the TFTs is further increased.

Two kinds of semiconductor substrates (p-type and n-type) are used in this embodiment mode; however, for example, the semiconductor layer 306 having two kinds of crystal plane directions may be formed over the insulating substrate 305 by using a p-type (or n-type) semiconductor substrate and an n-type (or p-type) well may be formed in a region whose crystal plane direction is {110} (or {100}).

Embodiment Mode 2

Although a semiconductor substrate whose crystal plane direction is {100} is used in Embodiment Mode 1, the case where a semiconductor substrate 212 is manufactured using a semiconductor substrate whose crystal plane direction is {110} will be described in this embodiment mode as shown in FIGS. 5A, 5B, 6A, and 6B First, a semiconductor substrate having p-type conductivity whose crystal plane direction is {110} is processed to have a quadrangular shape. At this time, a first semiconductor substrate 111 is formed so that alternate arrangement of crystal plane directions {100} and {110} appears on a side surface of the substrate (see FIG. 5A). In a similar manner, a semiconductor substrate having n-type conductivity whose crystal plane direction is {110} is processed to have a quadrangular shape. At this time, a second semiconductor substrate 112 is formed so that alternate arrangement of crystal plane directions {100} and {110} appears on a side surface of the substrate (see FIG. 5B).

Next, in a similar manner to Embodiment Mode 1, silicon oxide films 103 and 104 are formed over one surface of the first semiconductor substrate 111 and one surface of the second semiconductor substrate 112, respectively. The silicon oxide film is preferably formed by a CVD method, a plasma CVD method, or the like, using, for example, a mixed gas of a TEOS gas and an oxygen gas to have a thickness greater than or equal to 10 nm and less than or equal to 800 nm.

Figure 6A:
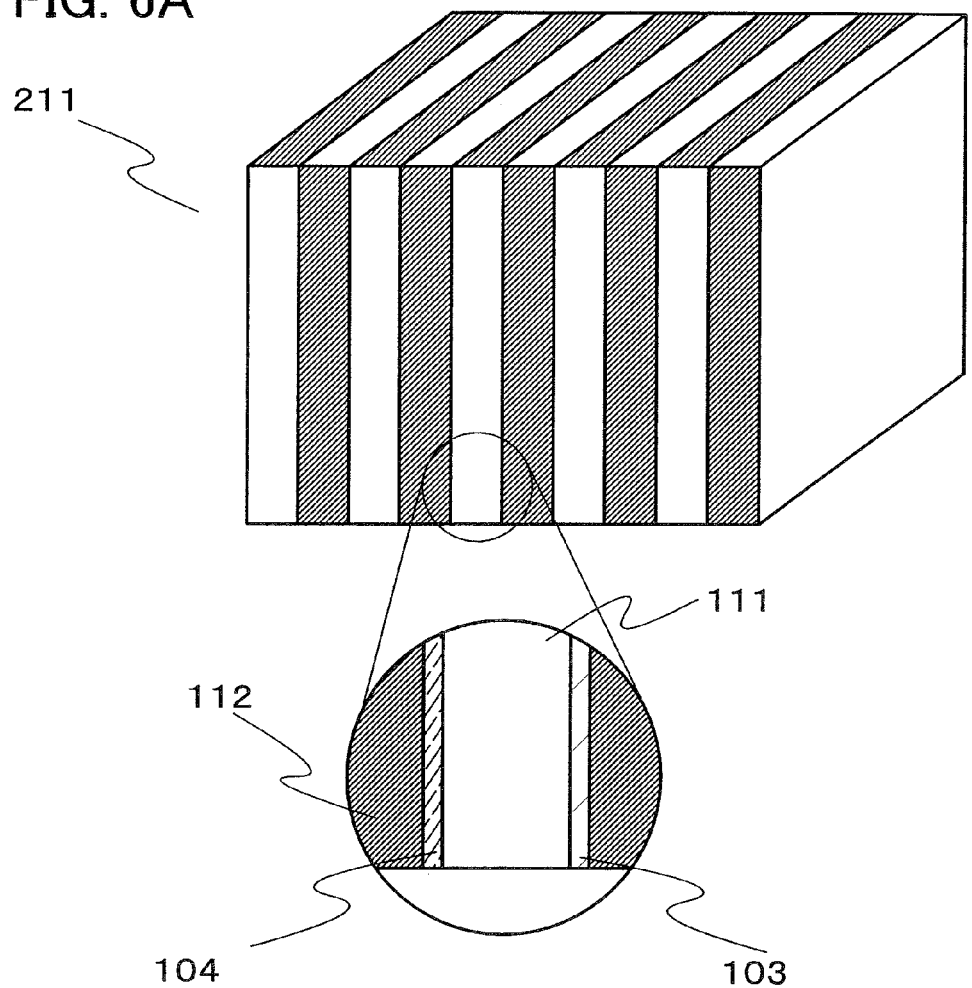
FIGS. 6A and 6B are views illustrating a process for manufacturing a semiconductor substrate.

Then, a plurality of the first semiconductor substrates 111 and a plurality of the second semiconductor substrates 112 are arranged alternately and bonded to each other, and then a semiconductor ingot 211 having a quadrangular prism shape, which has a stacked-layer structure, is manufactured (see FIG. 6A). At this time, a bond is performed so that alternate arrangement of crystal plane directions {100} and {110} appears in a side surface of the semiconductor ingot 211. The silicon oxide film 103 formed over one surface of the first semiconductor substrate 111 and a surface of the second semiconductor substrate 112, over which the silicon oxide film 104 is not formed, or the silicon oxide film 104 formed over one surface of the second semiconductor substrate 112 and a surface of the first semiconductor substrate 111, over which the silicon oxide film 103 is not formed are in contact with each other, whereby a bond is formed. This bond can be performed at room temperature. This bond is carried out at the atomic level, and a strong bond is formed at room temperature by van der Waals' forces. If necessary, the bond may be further strengthened by performing heat treatment on the semiconductor ingot 211. Further, the silicon oxide films 103 and 104 may be formed on both surfaces of the first semiconductor substrate 111 and the second semiconductor substrate 112 to form the bond.

Accordingly, in four surfaces out of the six surfaces included in the semiconductor ingot 211, alternate stripes of different crystal plane directions appear. Note that a size of the semiconductor ingot 211 and the thickness of each layer in a stripe shape can be selected as appropriate in accordance with the diameter of the semiconductor substrate, the thickness of the semiconductor substrate, the number of semiconductor substrates to be superposed, and the like.

Note that in this embodiment mode, the semiconductor substrates are processed to have a quadrangular shape in advance and the substrates are bonded to each other. However, the first and the second semiconductor substrates in a circular shape may be arranged alternately and bonded to each other while displacing the substrate by 90° C. or 270° C. from another substrate with the centers of the circular substrates used as a rotation axis, whereby the semiconductor ingot is manufactured. After that, the resulting ingot may be processed to have a quadrangular prism shape.

Figure 6B:
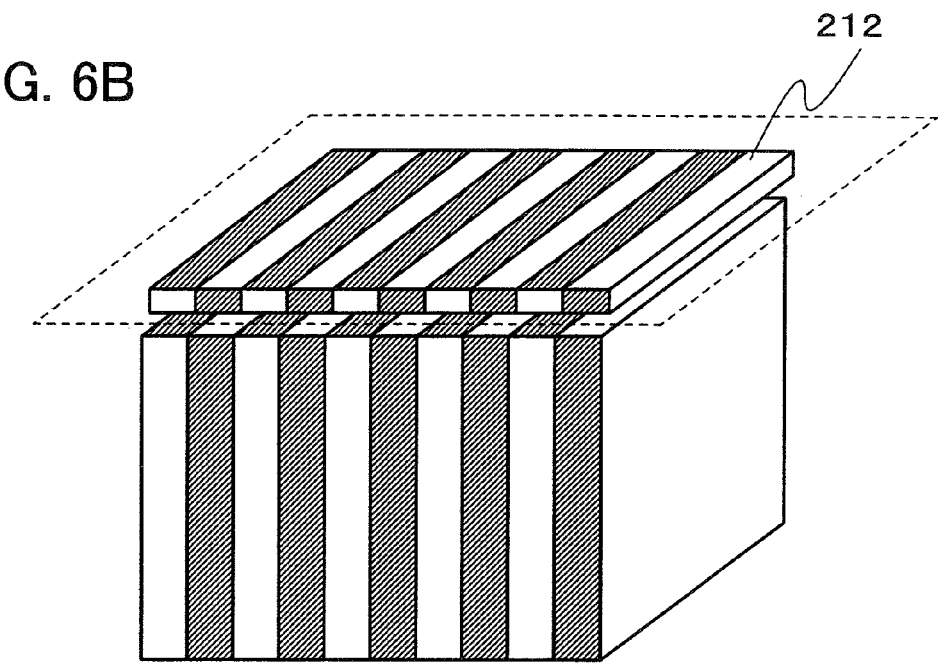

Next, in similar manner to Embodiment Mode 1, the semiconductor ingot 211 is thinly sliced parallel to a surface in which alternate stripes of different crystal plane directions appear and the surface of the substrate is planarized by CMP or the like, whereby a quadrangular semiconductor substrate 212 is formed (see FIG. 6B). Note that a process for transferring the semiconductor layer from the quadrangular semiconductor substrate 212 to the insulating substrate is based on a method described in Embodiment Mode 1.

Embodiment Mode 3

In this embodiment mode, an example of a process for manufacturing an inverter circuit which is one example of a semiconductor device using a CMOS circuit will be described. Note that the present invention is not limited to such a simple circuit and can realize various integrated circuits such as a microprocessor. FIGS. 7A, 8A, 9A, 10A, 11A, 12A, and 13A each are a top view of an inverter circuit, and FIGS. 7B, 8B, 9B, 10B, 11B, 12B, and 13B each are a cross sectional view taken along A-B in each of FIGS. 7A, 8A, 9A, 10A, 11A, 12A, and 13A.

A semiconductor device formed using an SOI substrate which is formed in such a manner that a semiconductor layer 306 shown in FIG. 4 is formed over an insulating substrate 305 with an insulating film 417 interposed therebetween is manufactured. A quadrangular semiconductor substrate 212 shown in FIG. 6B of the Embodiment 2 may be used to form the semiconductor layer. First, the semiconductor layer 306 is etched to have an island shape, and a plurality of first active layers 400a and a plurality of second active layers 400b are formed from a first semiconductor layer 306a having a {110} plane and a second semiconductor layer 306b having a {100} plane, respectively. The first active layer 400a is used for a channel formation region of a p-channel TFT and the second active layer 400b is used for a channel formation region of an n-channel TFT. At this time, an insulating film 417 may be etched concurrently with the semiconductor layer 306. Note that the insulating film 417 is a stacked-layer insulating film of a silicon oxynitride film 301, a silicon nitride oxide film 302, and a bonding layer 304.

Figure 7A:
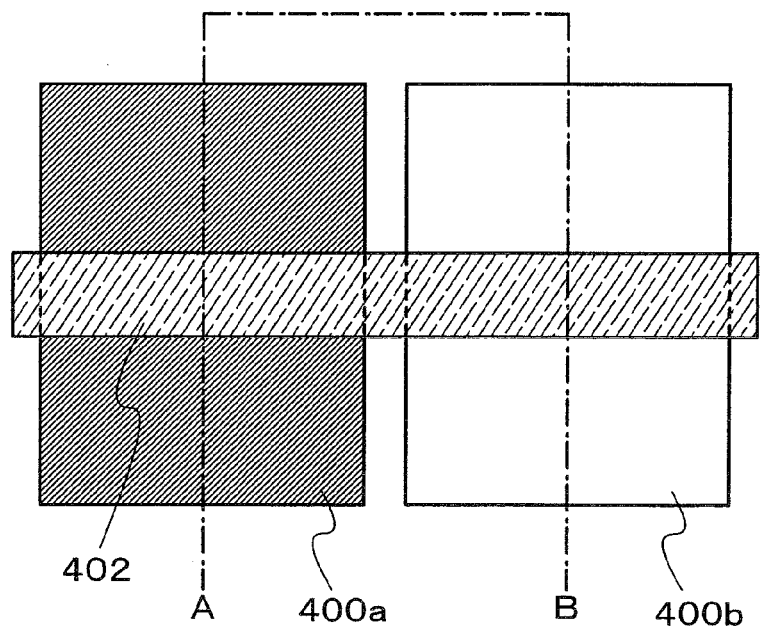
FIGS. 7A and 7B are views illustrating a process for manufacturing a semiconductor device.
Figure 7B:
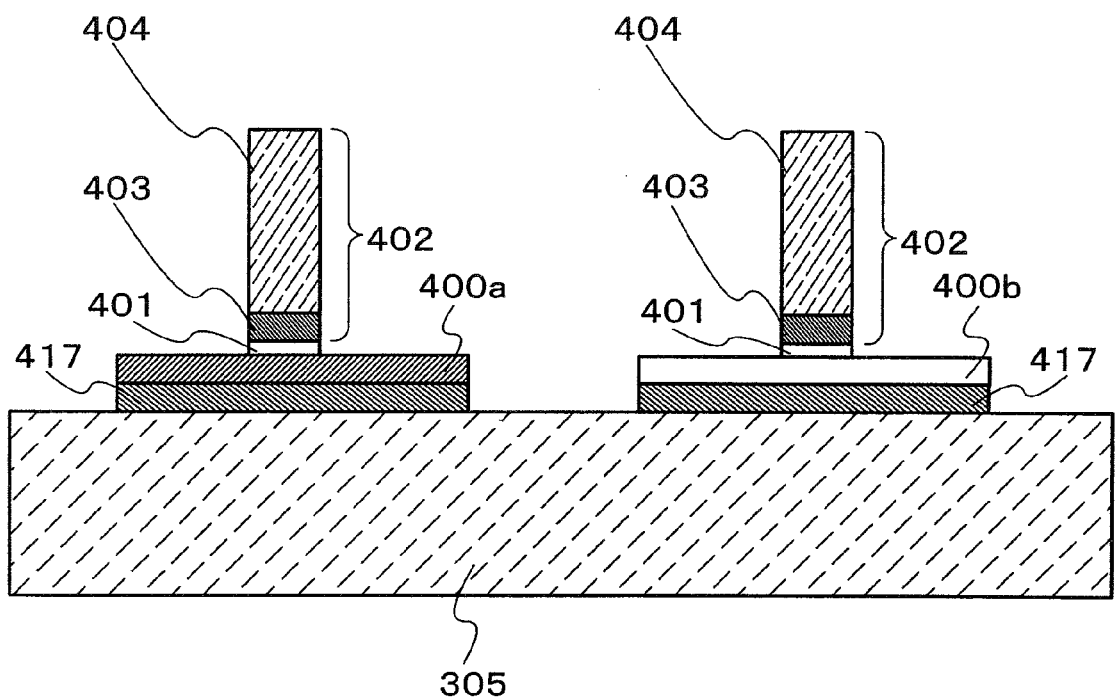

FIGS. 7A and 7B illustrate a step for forming a gate insulating layer and a gate electrode over an insulating substrate 305 provided with the first active layer 400a and the second active layer 400b which are processed to have an island shape. A gate electrode layer 402 is provided over the first active layer 400a and the second active layer 400b with a gate insulating layer 401 interposed therebetween. As the gate insulating layer 401, a material such as silicon oxide ($SiO_x$), silicon oxynitride ($SiO_xN_y$), hafnium oxide ($HfO_x$), aluminum oxide ($Al_xO_y$, where x>y>0), or tantalum oxide ($TaxO_y$, where x>y>0) can be used. In FIG. 7B, processing is conducted so that side end portions of the gate insulating layer 401 and the gate electrode layer 402 are aligned; however, in etching the gate electrode layer 402, processing may be conducted so that the gate insulating layer 401 remains. For example, processing may be conducted so that the gate insulating layer 401 has a tapered shape.

The gate electrode layer 402 may have a single layer structure or a stacked-layer structure. In this embodiment mode, the case of a stacked-layer structure of a first gate electrode layer 403 and a second gate electrode layer 404 will be described. In the case of using a high dielectric material (high-k material) for the gate insulating layer 401, the gate electrode layer 402 is formed using polycrystalline silicon, silicide, metal, or metal nitride. Preferably, the gate electrode layer 402 is formed using metal or metal nitride. Considering that the gate electrode layer has a stacked-layer structure, the first gate electrode layer 403 which is in contact with the gate insulating layer 401 can be formed using a metal nitride material, and the second gate electrode layer 404 can be formed using a metal material. This combination can prevent spread of a depletion layer in the gate electrode even when the gate insulating layer are thinned and can also prevent reduction in driving performance of transistors even when miniaturization is conducted.

Figure 8A:
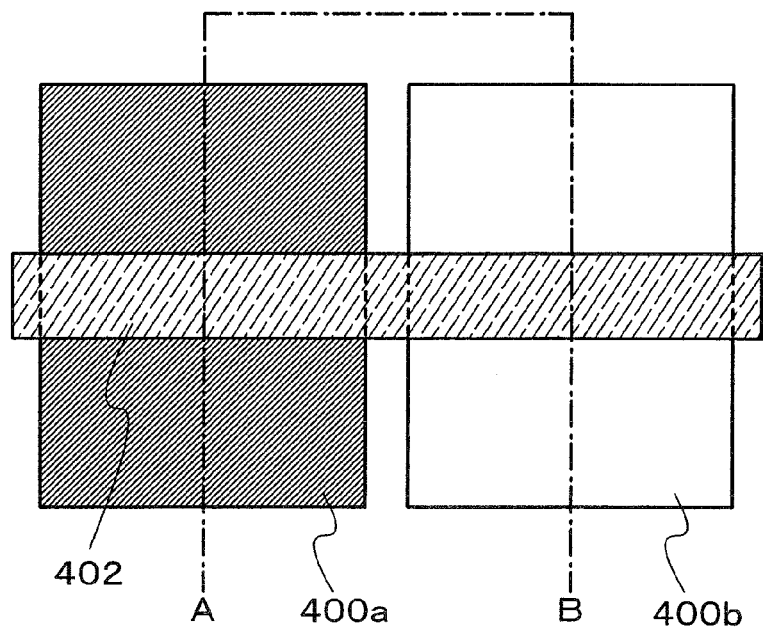
FIGS. 8A and 8B are views illustrating a process for manufacturing a semiconductor device.
Figure 8B:
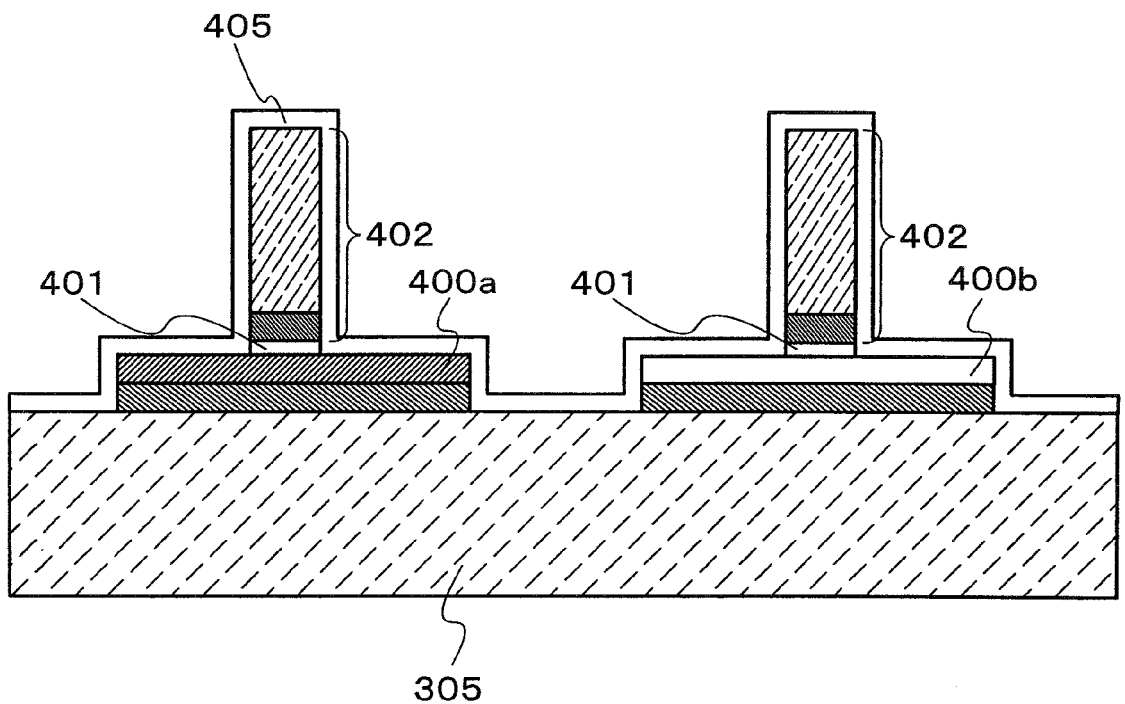

FIGS. 8A and 8B illustrate a step for forming a first insulating layer 405 over the gate electrode layer 402. The first insulating layer 405 is formed using a silicon oxide film or a silicon oxynitride film by a CVD method or a sputtering method. As another mode, the gate electrode layer 402 may be partly insulated by oxidation or nitridation treatment to form a similar layer to the first insulating layer 405. The first insulating layer 405 is formed with a thickness of 1 nm to 10 nm also on the side surfaces of the gate electrodes layer 402. The first insulating layer 405 is formed in order to form an offset region as well, to which an impurity for valence electron control is not added, in the first active layer 400a and the second active layer 400b.

Figure 9A:
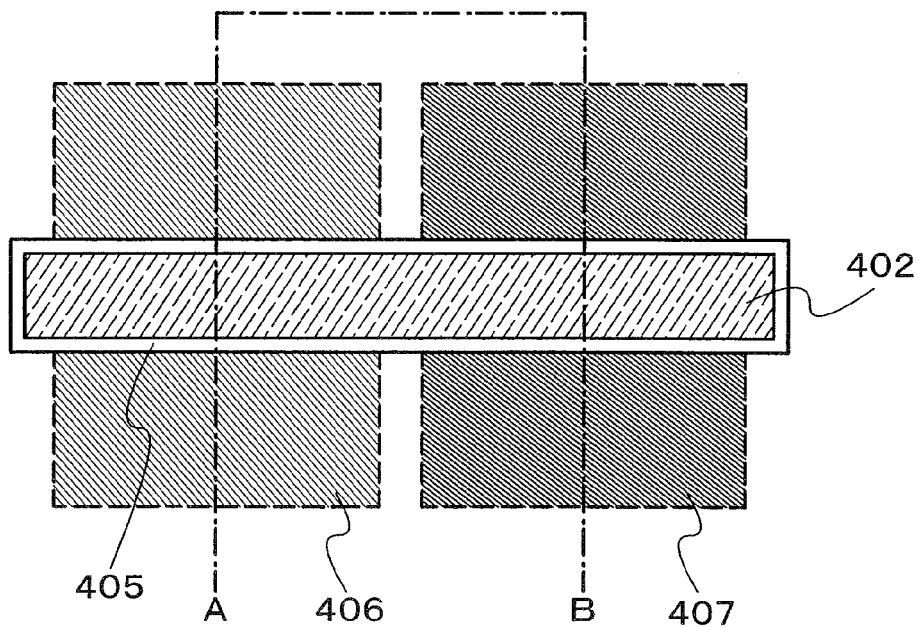
FIGS. 9A and 9B are views illustrating a process for manufacturing a semiconductor device.
Figure 9B:
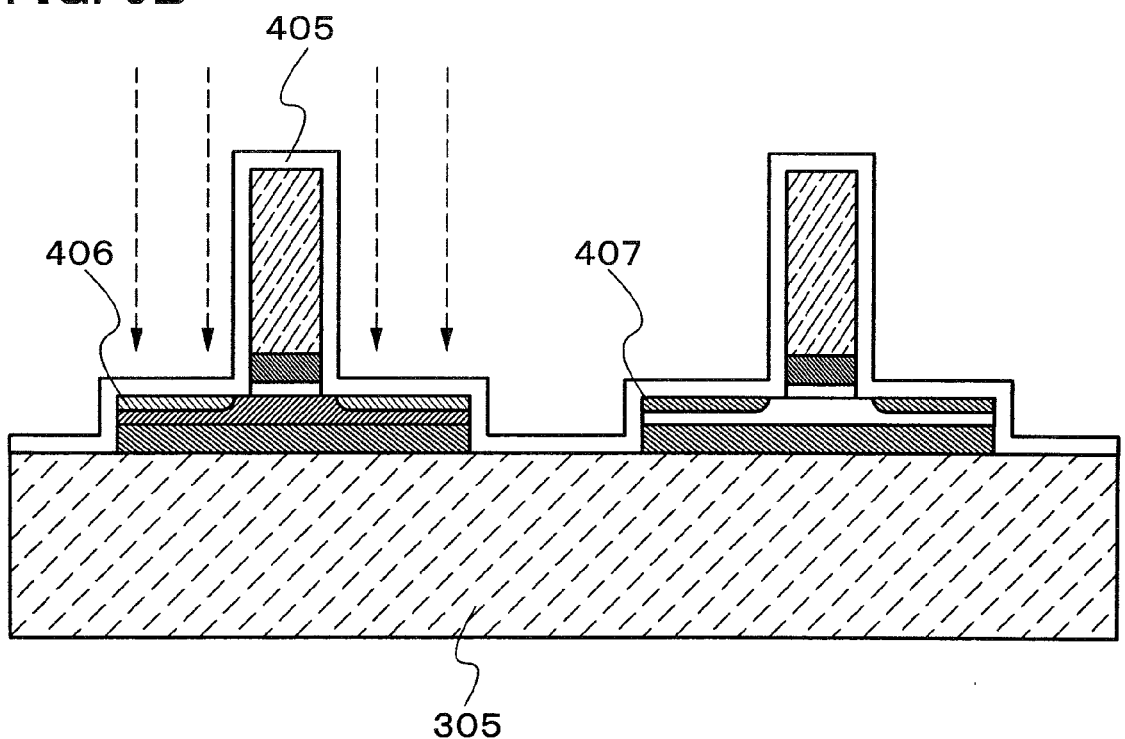

FIGS. 9A and 9B illustrate a step for forming ultrashallow impurity regions (source/drain extensions) in the first active layer 400a and the second active layer 400b. With these ultrashallow impurity regions, a short channel effect can be suppressed. First ultrashallow impurity regions 406 to which an element belonging to Group 13 of the periodic table is added is formed in the first active layer 400a of a p-channel TFT, and second ultrashallow impurity regions 407 to which an element belonging to Group 15 of the periodic table is added is formed in a second active layer 400b of an n-channel TFT. In FIG. 9A, for clearly illustrating the ultrashallow impurity regions 406 and 407, only part of the first insulating layer 405 in the periphery of the gate electrode layer 402 is shown and the ultrashallow impurity regions 406 and 407 are shown outside the first insulating layer 405 by dotted lines; however, the insulating layer 405 covers the whole of the first active layer 400a, the second active layer 400b, and the gate electrode layer 402. The impurity concentration of these ultrashallow impurity regions are, for example, set in the following way: the first ultrashallow impurity regions 406 are formed by ion implantation of boron at 15 keV with a dose of $3\times10^{13}/cm^2$ and the second ultrashallow impurity regions 407 are formed by ion implantation of arsenic at 15 keV with a dose of $2\times10^{14}/cm^2$.

Figure 10A:
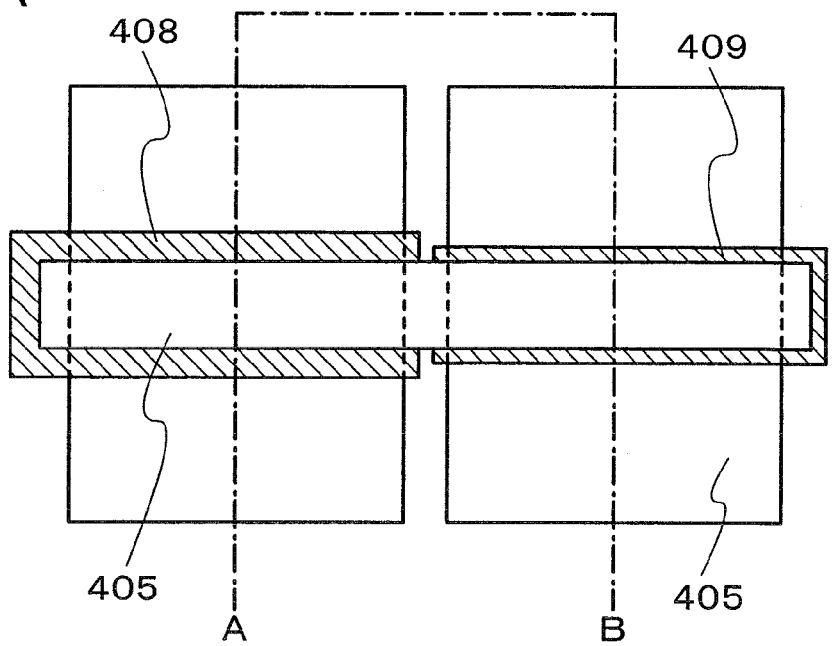
FIGS. 10A and 10B are views illustrating a process for manufacturing a semiconductor device.
Figure 10B:
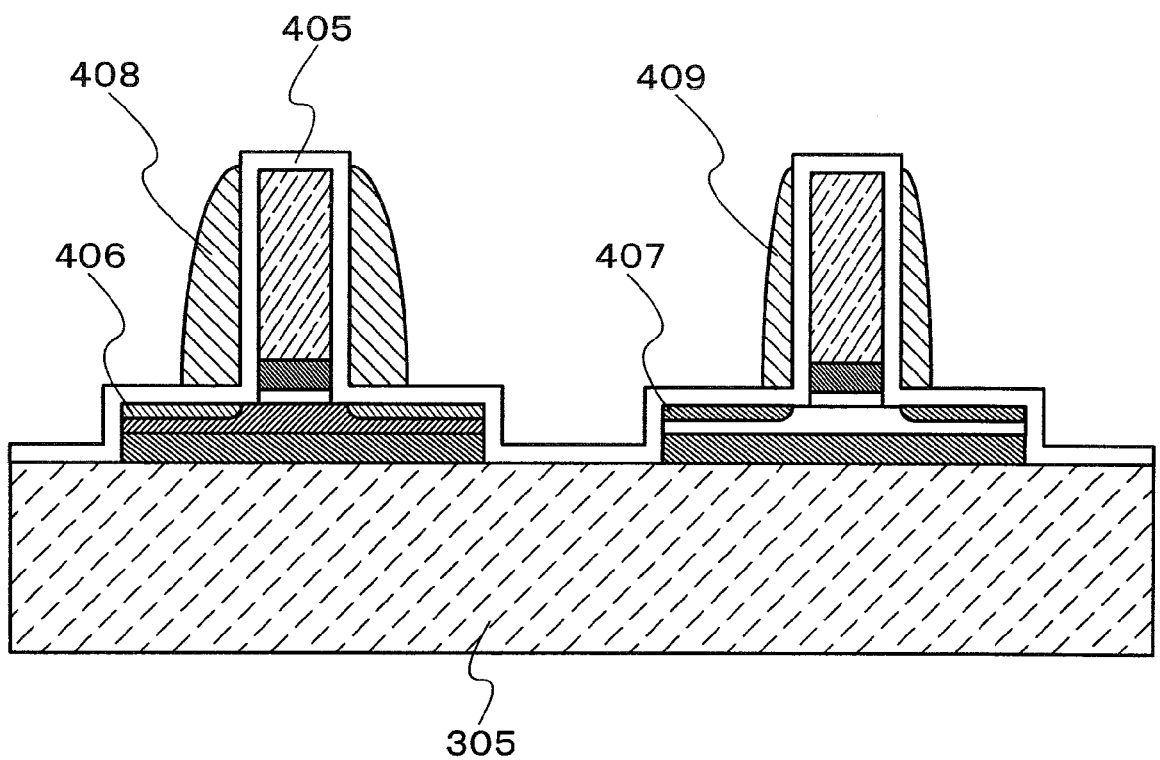

Next, as illustrated in FIGS. 10A and 10B, a first sidewall 408 and a second sidewall 409 are formed on the side surfaces of the gate electrode layer 402. For example, the first sidewall 408 and the second sidewall 409 are formed using a silicon nitride film. These sidewalls are formed in a self-aligned manner by anisotropic etching.

In this case, the first sidewall 408 on the first active layer 400a side and the second sidewall 409 on the second active layer 400b side may be processed to have the same width, but are preferably processed to have different widths. It is preferable that the first sidewall 408 on the first active layer 400a side of the p-channel TFT have larger thickness than the second sidewall 409 on the second active layer 400b side of the n-channel TFT. This is because boron implanted to form a source region and a drain region in the p-channel TFT is easily diffused and tends to induce a short channel effect. This structure allows boron to be added to the source region and the drain region at a high concentration and can rather decrease resistance of the source region and the drain region in the p-channel TFT.

Figure 11A:
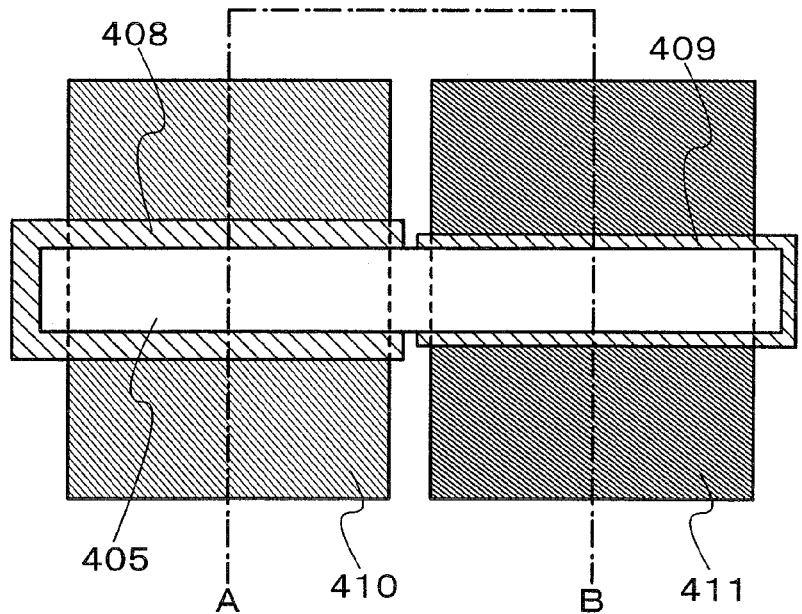
FIGS. 11A and 11B are views illustrating a process for manufacturing a semiconductor device.
Figure 11B:
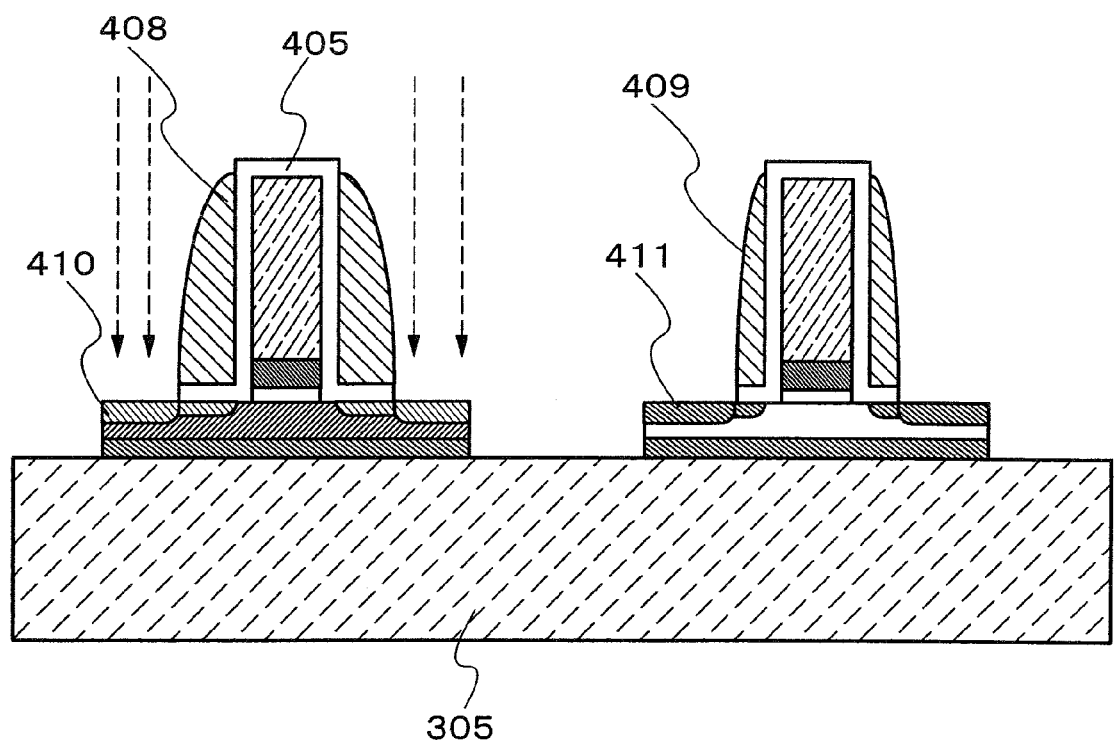

After forming the sidewalls as illustrated in FIGS. 11A and 11B, exposed part of the first insulating layer 405 is etched, and source and drain regions are formed in a self-aligned manner. This step can be conducted by an ion implantation method in which impurity ions for valence electron control are accelerated by an electric field and implanted. FIG. 11B illustrates a state in which an element belonging to Group 13 of the periodic table is added to the first active layer 400a to form first impurity regions 410 to be a source and drain regions. An element belonging to Group 15 of the periodic table is added to the second active layer 400b to form second impurity regions 411 to be a source and drain regions. For example, boron ions are implanted to the first active layer 400a of the p-channel TFT at 30 keV with a dose of $3\times10^{15}/cm^2$. Arsenic are implanted to the second active layer 400b of the n-channel TFT at 50 keV with a dose of $5\times10^{15}/cm^2$. The above-described doping conditions such as ion species, the acceleration voltage, and dose are only examples, and the doping conditions can be set as appropriate.

In order to further decrease resistance of the source and drain regions, a silicide layer may be formed in the first and second active layers. As the silicide layer, cobalt silicide or nickel silicide may be employed, and it is preferable that silicide be formed at least in the source region and drain regions. A silicide layer is formed in a top surface and an end surface of the active layer. When the active layer is thin or something, silicide reaction may be made to proceed to the bottom part of the active layer to decrease resistance. Further, when polycrystalline silicon is used for the gate electrode layer 402, in order to further decrease resistance of the gate electrode layer 402, it is preferable that the first insulating layer 405 is etched and that the silicide layer is formed over the gate electrode layer. The silicide layer formed in the source region and drain region and the silicide layer formed in the gate electrode layer can be manufactured simultaneously.

Figure 12A:
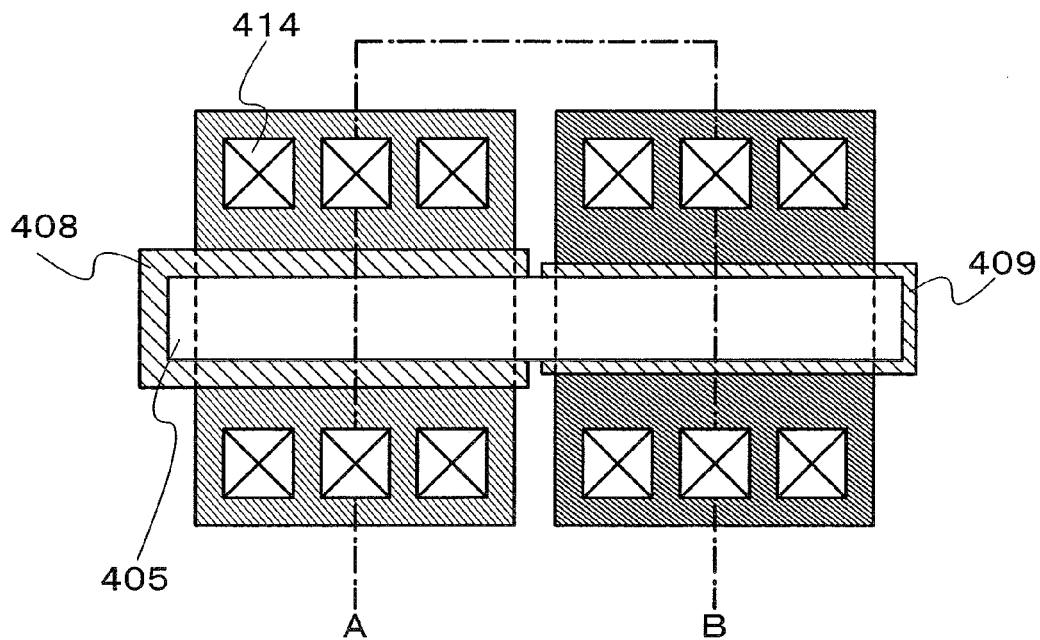
FIGS. 12A and 12B are views illustrating a process for manufacturing a semiconductor device.
Figure 12B:
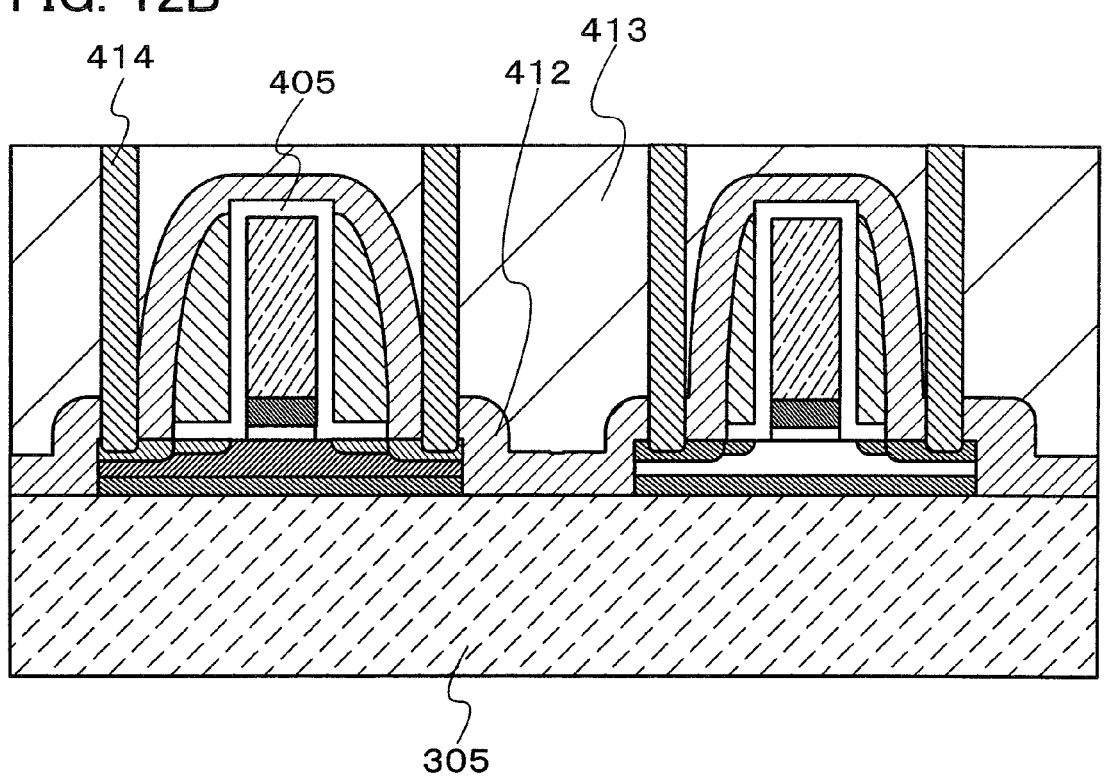

FIGS. 12A and 12B illustrate a step for forming a passivation layer 412, a first interlayer insulating layer 413, and contact plugs 414. The passivation layer 412 is formed over the entire surface by a CVD method, using a silicon nitride film, a silicon nitride oxide film, or the like. The first interlayer insulating layer 413 is formed using phosphosilicate glass (PSG) or borophosphosilicate glass (BPSG) by a CVD method and planarized by reflow. Alternatively, a silicon oxide film may be formed using tetraethoxysilane (tetraethyl-ortho-silicate, $Si(OCH_2CH_3)_4$) by a CVD method and then be planarized by CMP. The contact plugs 414 are formed from tungsten silicide so as to fill contact holes which are formed in the first interlayer insulating layer 413. Tungsten silicide is formed by a CVD method using tungsten hexafluoride ($WF_6$) and silane ($SiH_4$).

Figure 13A:
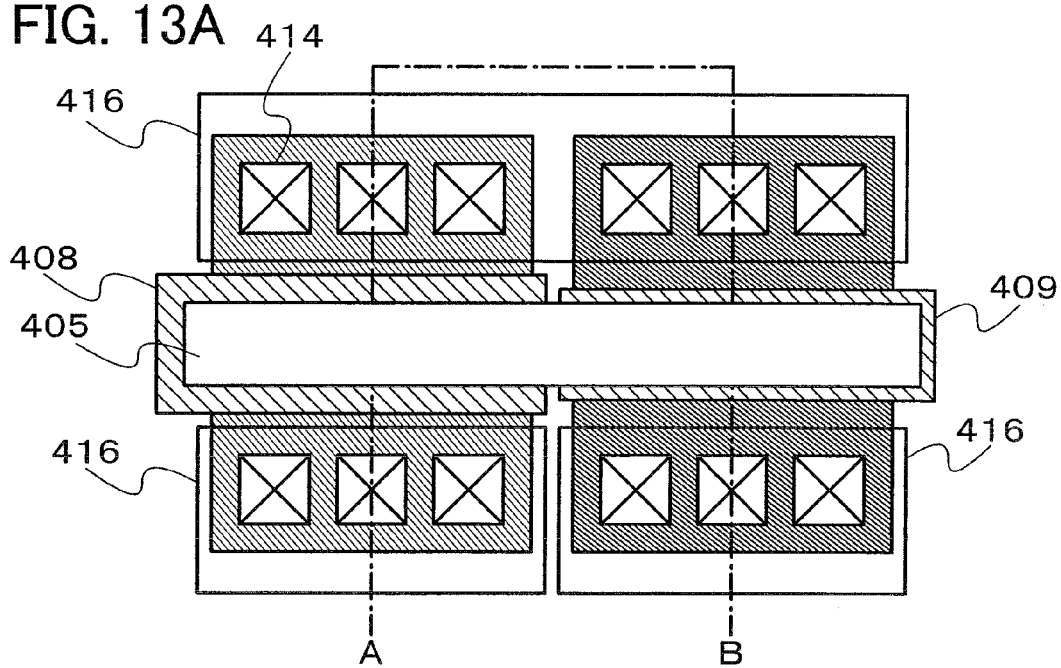
FIGS. 13A and 13B are views illustrating a process for manufacturing a semiconductor device.
Figure 13B:
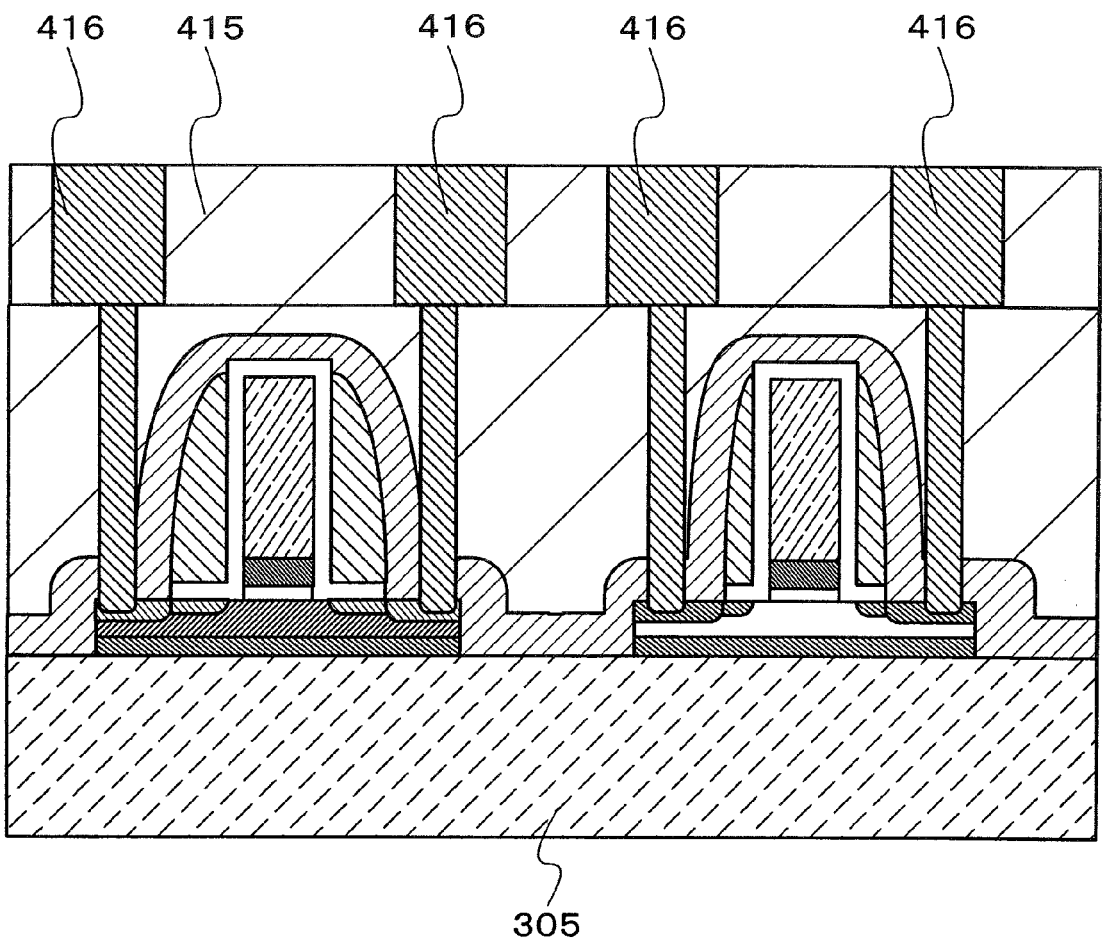

A multilayer structure of a wiring is considered depending on structures of a semiconductor element and a device that uses the element. FIGS. 13A and 13B illustrate a structure in which a second interlayer insulating layer 415 and wirings 416 are provided over the first interlayer insulating layer 413. The wirings may be formed using tungsten silicide or may be formed using Cu wirings by a damascene method.

Embodiment Mode 4

In this embodiment mode, a mode of a microprocessor will be described as an example of a device including a semiconductor element (a semiconductor device) with reference to FIG. 14.

Figure 14:
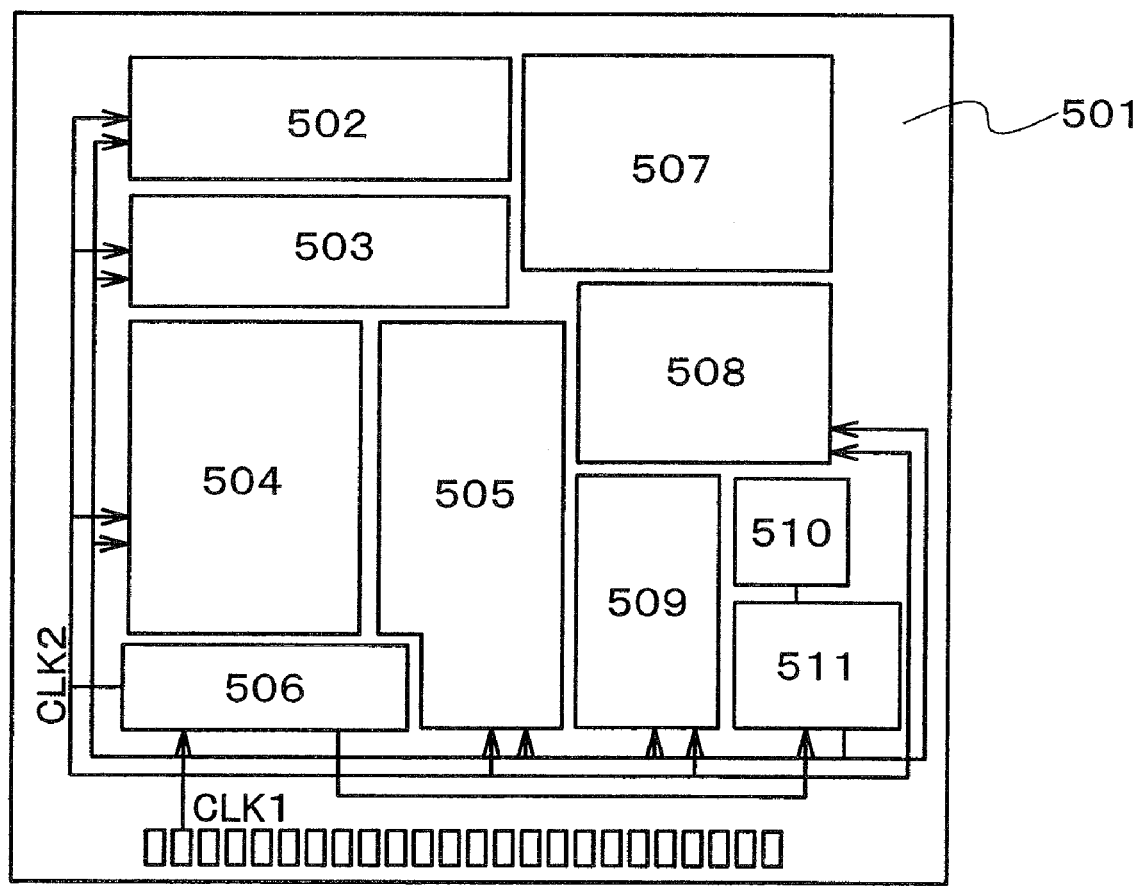
FIG. 14 is a block diagram illustrating a mode of a microprocessor.

FIG. 14 illustrates an example of a microprocessor 501. In this microprocessor 501, an active layer included in an n-channel TFT and an active layer included in a p-channel TFT each have different crystal plane directions.

This microprocessor 501 includes an arithmetic logic unit (also referred to as an ALU) 502, an ALU controller 503, an instruction decoder 504, an interrupt controller 505, a timing controller 506, a register 507, a register controller 508, a bus interface (Bus I/F) 509, a read only memory 510, and a memory interface 511 (ROM I/F).

An instruction input to the microprocessor 501 through the bus interface 509 is input to the instruction decoder 504 and decoded. Then, the instruction is input to the ALU controller 503, the interrupt controller 505, the register controller 508, and the timing controller 506. The ALU controller 503, the interrupt controller 505, the register controller 508, and the timing controller 506 perform various controls based on the decoded instruction. Specifically, the ALU controller 503 generates a signal for controlling the operation of the arithmetic logic unit 502. While the microprocessor 501 is executing a program, the interrupt controller 505 determines an interrupt request from an external input/output device or a peripheral circuit depending on its priority or a mask state, and processes the request. The register controller 508 generates an address of the register 507, and reads/writes data from/to the register 507 in accordance with the state of the microprocessor.

The timing controller 506 generates signals for controlling timing of operations of the arithmetic logic unit 502, the ALU controller 503, the instruction decoder 504, the interrupt controller 505, and the register controller 508. For example, the timing controller 506 is provided with an internal clock generator for generating an internal clock signal CLK2 based on a reference clock signal CLK1, and supplies the internal clock signal CLK2 to each of the above-described circuits. Note that the microprocessor 501 illustrated in FIG. 14 is just an example of the simplified structure, and practical CPUs have various structures depending on usage.

In the microprocessor of this embodiment mode a first active layer included in a p-channel TFT and a second active layer included in an n-channel TFT are provided for the same plane of an insulating substrate, and the first active layer and the second active layer each have different crystal plane directions. In this manner, by employing a crystal plane by which mobility of carriers flowing through a channel of a TFT is increased, high speed operation of the microprocessor can be achieved. Further, low voltage driving can be performed, and low power consumption can be achieved. In other words, the possibility of carriers scattered by atoms can be reduced, whereby resistance which electrons and holes meet with can be reduced, and performance of the microprocessor can be improved.

Embodiment Mode 5

In this embodiment mode a mode of a microcomputer including a communication circuit and capable of inputting and outputting data without contact will be described as an example of a device including a semiconductor element, with reference to FIG. 15.

Figure 15:
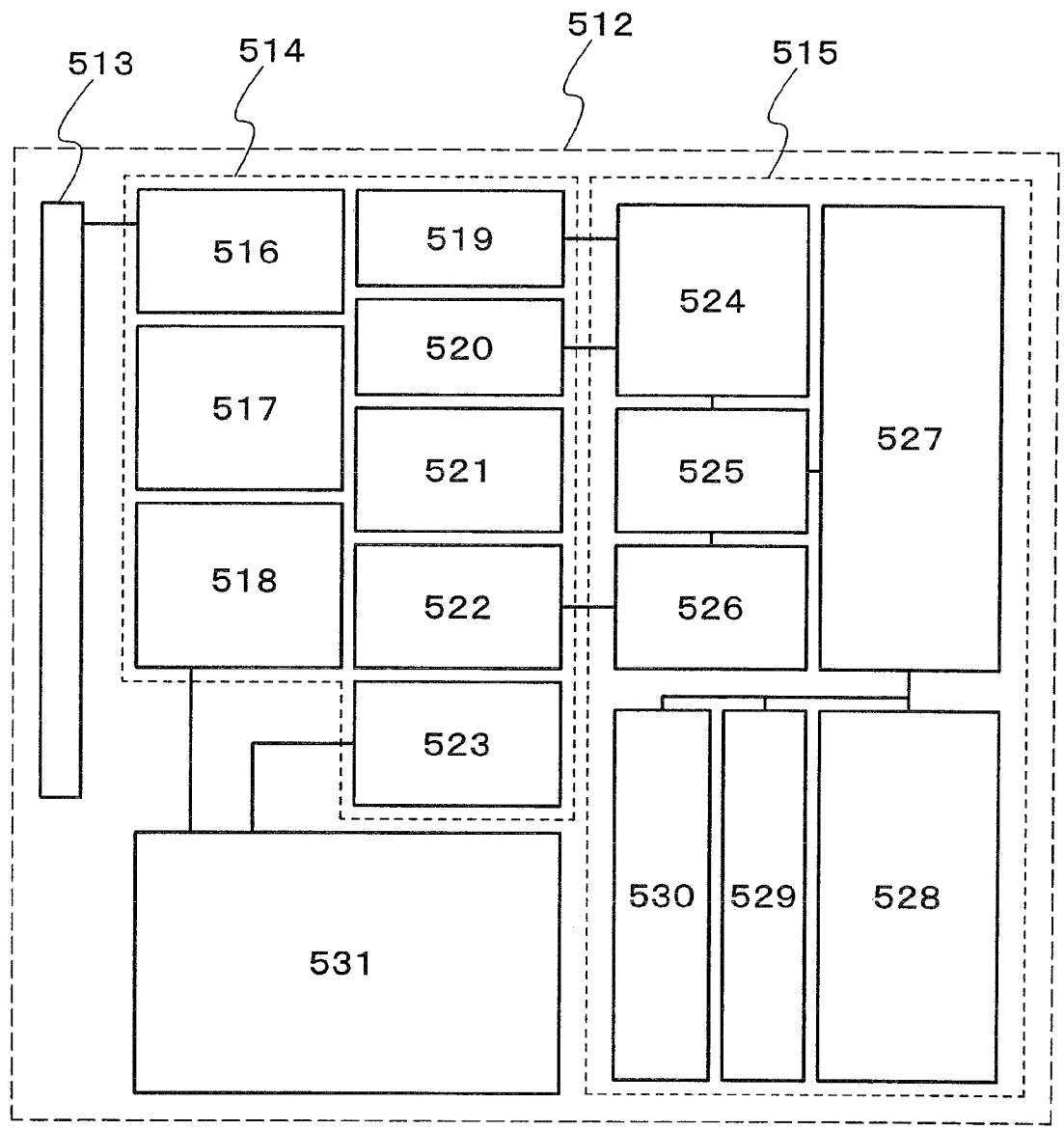
FIG. 15 is a block diagram illustrating a mode of a microcomputer.

FIG. 15 illustrates a block diagram of a microcomputer 512 relating to this embodiment mode. This microcomputer 512 includes an antenna circuit 513, an analog circuit portion 514, and a digital circuit portion 515. The analog circuit portion 514 includes a resonance circuit 516 having a resonant capacitor, a constant voltage circuit 517, a rectifier circuit 518, a demodulation circuit 519, a modulation circuit 520, a reset circuit 521, an oscillator circuit 522, and power management circuit 523. The digital circuit portion 515 includes an RF interface 524, a control register 525, a clock controller 526, an interface 527, a central processing unit 528, a random access memory 529, and a read only memory 530. Electric power necessary for operation of the microcomputer 512 is supplied in such a manner that a wireless signal is received by the antenna circuit 513 and rectified by the rectifier circuit 518, and the electric power is stored in a capacitor portion 531. The capacitor portion 531 includes a capacitor such as a ceramic capacitor or an electric double layer capacitor. The power storage portion 531 is not necessarily integrated with the microcomputer 512 and may be bonded to a substrate having an insulating surface that partially constitutes the microcomputer 512 as another component.

Operation of the microcomputer 512 having the above-described structure is described below. The resonance circuit 516 generates an induced electromotive force based on a signal received by the antenna circuit 513. The input signal is demodulated at the demodulation circuit 519, and a control instruction and a data signal are output to the digital circuit portion 515. The reset circuit 521 generates a signal that resets the digital circuit portion 515 to be initialized. For example, the reset circuit generates a signal which rises after rise in the power supply voltage with delay as a reset signal. The oscillation circuit 522 changes the frequency and the duty ratio of a clock signal in response to a control signal generated by the constant voltage circuit 517. The demodulation circuit 519 having a low pass filter binarizes changes in amplitude of reception signals of an amplitude shift keying (ASK) system, for example. The modulation circuit 520 changes the amplitude of transmission signals of an amplitude shift keying (ASK) system to be transmitted. The modulation circuit 520 changes the resonance point of the resonance circuit 516, thereby changing the amplitude of communication signals. The clock controller 526 generates a control signal for changing the frequency and the duty ratio of the clock signal in accordance with the power supply voltage or current consumption in the central processing unit 528. The power supply voltage is monitored by the power supply control circuit 523.

A signal that is input to the microcomputer 512 from the antenna circuit 513 is demodulated at the demodulation circuit 519, and then divided into a control command, data, and the like by the RF interface 524. The control command is stored in the control register 525. The control command includes reading of data stored in the read only memory 530, writing of data to the random access memory 529, an arithmetic instruction to the central processing unit 528, and the like. The central processing unit 528 accesses the read only memory 530, the random access memory 529, and the control register 525 via the interface 527. The interface 527 has a function of generating an access signal for any one of the read only memory 530, the random access memory 529, and the control register 525 based on an address requested by the central processing unit 528.

As an arithmetic method of the central processing unit 528, a method may be employed in which the read only memory 530 stores an OS (operating system) and a program is read out and executed at the time of starting operation. Alternatively, a method may be employed, in which a circuit dedicated to arithmetic is formed as an arithmetic circuit and an arithmetic processing is conducted using hardware. In a method in which both hardware and software are used, a method can be employed, in which part of an arithmetic processing is conducted in the circuit dedicated to arithmetic and the other part of the arithmetic processing is conducted by the central processing unit 528 using a program.

Figure 16:
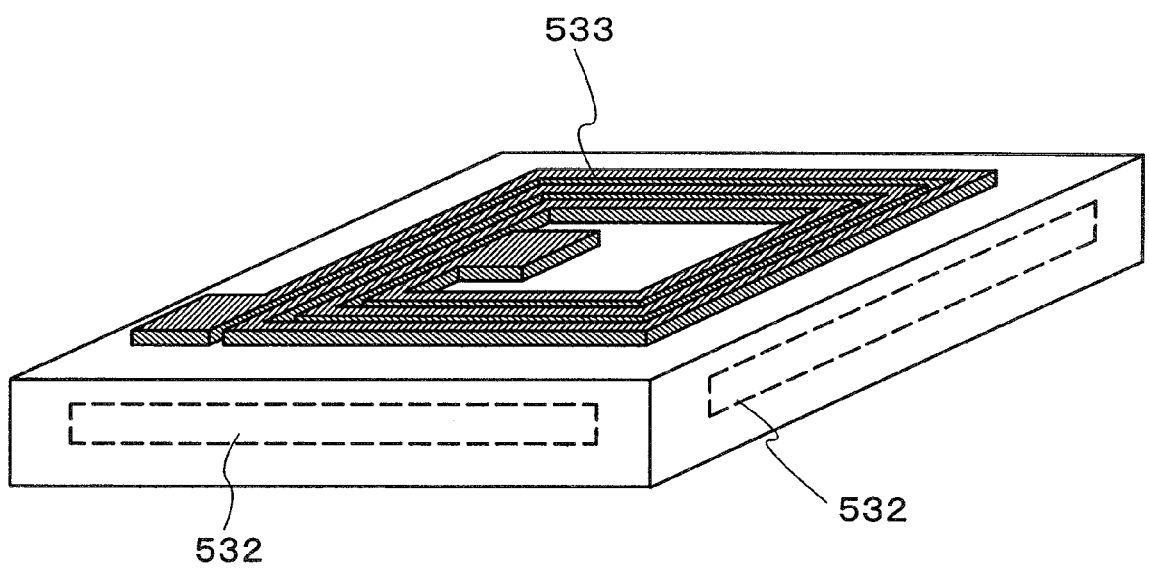
FIG. 16 is a perspective view illustrating an exterior example of a microcomputer.

FIG. 16 illustrates an exterior of a microcomputer relating to this embodiment mode having such a structure as described above. An insulating substrate 305 is provided with a plurality of active layers, thereby including an element formation layer 532 where an n-channel TFT and a p-channel TFT are formed. The element formation layer 532 forms the analog circuit portion 514 and the digital circuit portion 515 in FIG. 15. An antenna 533 is provided over the insulating substrate 305. Instead of the antenna 533, an antenna connection terminal may be provided. The antenna 533 illustrated in FIG. 16 is a magnetic-field spiral antenna; however, the antenna 533 may be combined with a dipole antenna or the like as an electric field antenna.

Figure 17:
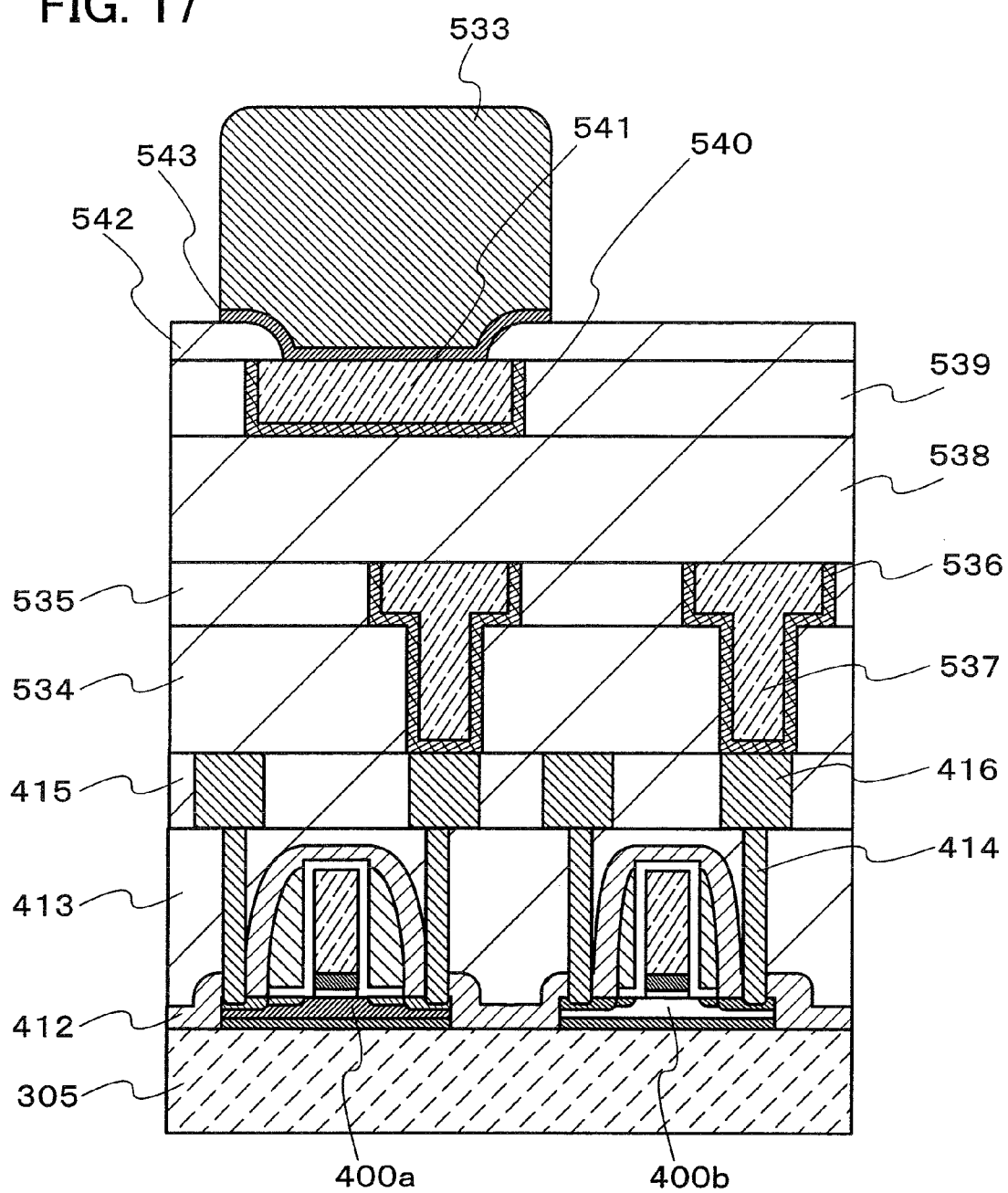
FIG. 17 is a cross sectional view illustrating a structure of a microcomputer.

FIG. 17 schematically illustrates a cross-sectional structure of a main section of the microcomputer illustrated in FIG. 16. A p-channel TFT and an n-channel TFT are formed over the insulating substrate 305, using a first active layer 400*a* and a second active layer 400*b*. Since the structure of layers that are lower than a second interlayer insulating layer 415 is similar to that in FIGS. 13A and 13B, explanation thereof is omitted.

A third interlayer insulating layer 534 and a fourth interlayer insulating layer 535 are formed over a first wiring 416. The third interlayer insulating layer 534 is formed using a silicon oxide film, and the fourth interlayer insulating layer 535 is formed using a silicon nitride film. Openings formed in the third interlayer insulating layer 534 by dual damascene are narrower than those formed in the fourth interlayer insulating layer 535. A barrier metal 536 of tantalum nitride or the like is formed in the openings, and a copper wiring 537 is formed by copper plating. Further, a fifth interlayer insulating layer 538 and a sixth interlayer insulating layer 539 are formed, an opening is formed only in the sixth interlayer insulating layer 539, and a barrier metal 540 and a copper wiring 541 by copper plating are provided in the opening. Over the copper wiring 541, a seventh interlayer insulating layer 542 is formed, and an opening for connecting the antenna 533 to the copper wiring 541 is formed. Then, the antenna 533 is provided over the seventh interlayer insulating layer 542 and connected to the copper wiring 541. In FIG. 17, a seed layer 543 is formed at a boundary of the antenna 533 and the copper wiring 541; however, the seed layer is provided in the case of forming the antenna 533 by a copper plating method. The antenna 533 can also be formed by direct drawing using an inkjet method, a printing method, or the like. Alternatively, a conductive film of aluminum or the like may be stacked by sputtering and processed to have an antenna shape by a photolithography method.

Productivity of such a microcomputer can be improved by using a large-area glass substrate as the insulating substrate 305. For example, a glass substrate of 730×920 mm is used for fourth-generation liquid crystal panels which are distributed in the market, and the area thereof is 671,600 mm². When microcomputers are taken from such a glass substrate, in the case of taking two-millimeter squares, roughly 340 thousand chips can be extracted without regard for margins of the chips. The thickness of the glass substrate is 0.4 mm to 0.7 mm, and when a protection film is attached to a surface opposite to a surface to which the active layers of the TFTs are fixed, the thickness of the device as a whole can be thinned to be about 0.1 mm to 0.3 mm.

In the microcomputer of this embodiment mode the first active layer included in the p-channel TFT and the second active layer included in the n-channel TFT are provided for the same plane of an insulating substrate, and the first active layer and the second active layer have different crystal plane directions. In this manner, by employing a crystal plane by which mobility of carriers flowing through a channel of the TFT is increased, high speed operation of the microcomputer can be achieved. Further, low voltage driving can be performed, and low power consumption can be achieved. In other words, the possibility of carriers scattered by atoms can be reduced, whereby resistance which electrons or holes meet with can be reduced, and performance of the microcomputer can be improved.

Embodiment Mode 6

In this embodiment mode, a CMOS transistor using a semiconductor substrate 202 in which two different crystal plane directions appear in the same surface will be described.

Figure 18:
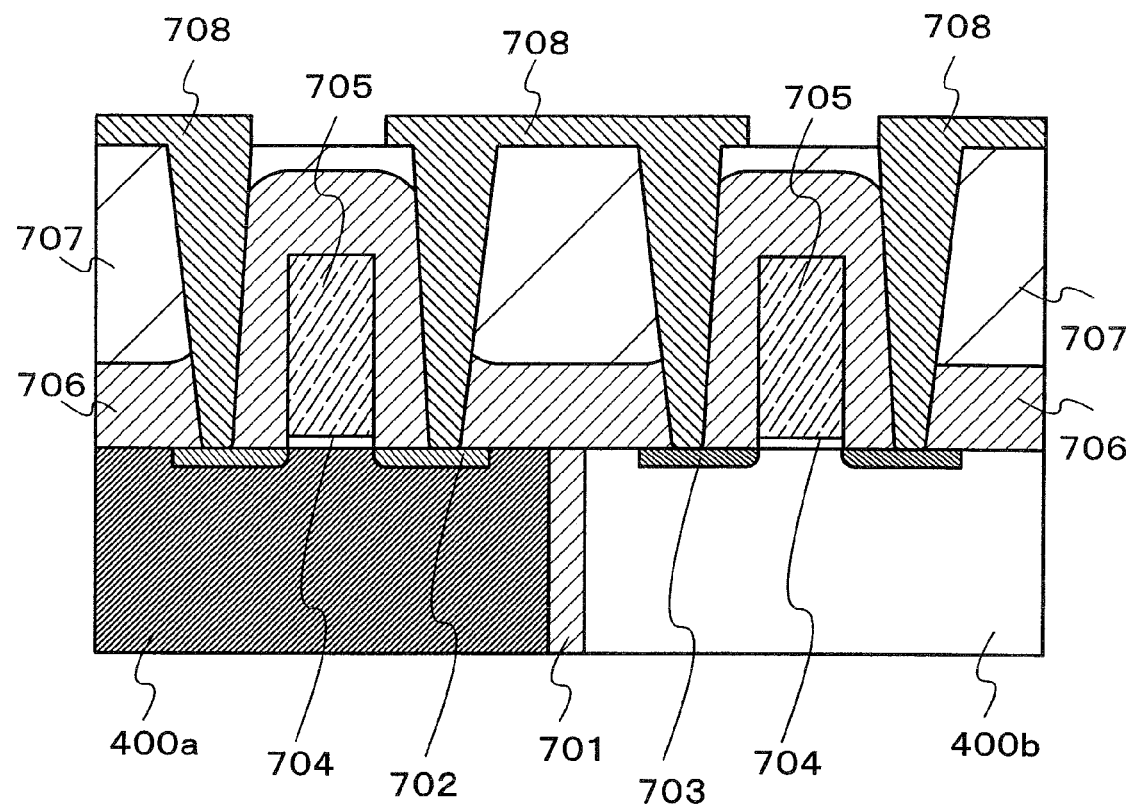
FIG. 18 is a cross sectional view of a structure of a CMOS transistor in Embodiment Mode 6.

FIG. 18 illustrates one example of the CMOS transistor which is formed using the semiconductor substrate 202. The CMOS transistor includes a first active layer 400*a*, a second active layer 400*b*, an insulating region 701, impurity regions 702 and 703, gate insulating layers 704, gate electrode layers 705, first insulating layers 706, second insulating layers 707, wirings 708, and the like. The first active layer 400*a* where a p-channel transistor is formed and the second active layer 206*b* where an n-channel transistor is formed each have a different crystal plane direction and crystal planes by which mobility of carriers flowing through each channel is increased are employed. Further, the n-channel transistor and the p-channel transistor are separated completely from each other by the presence of an insulating region 701.

Figure 19:
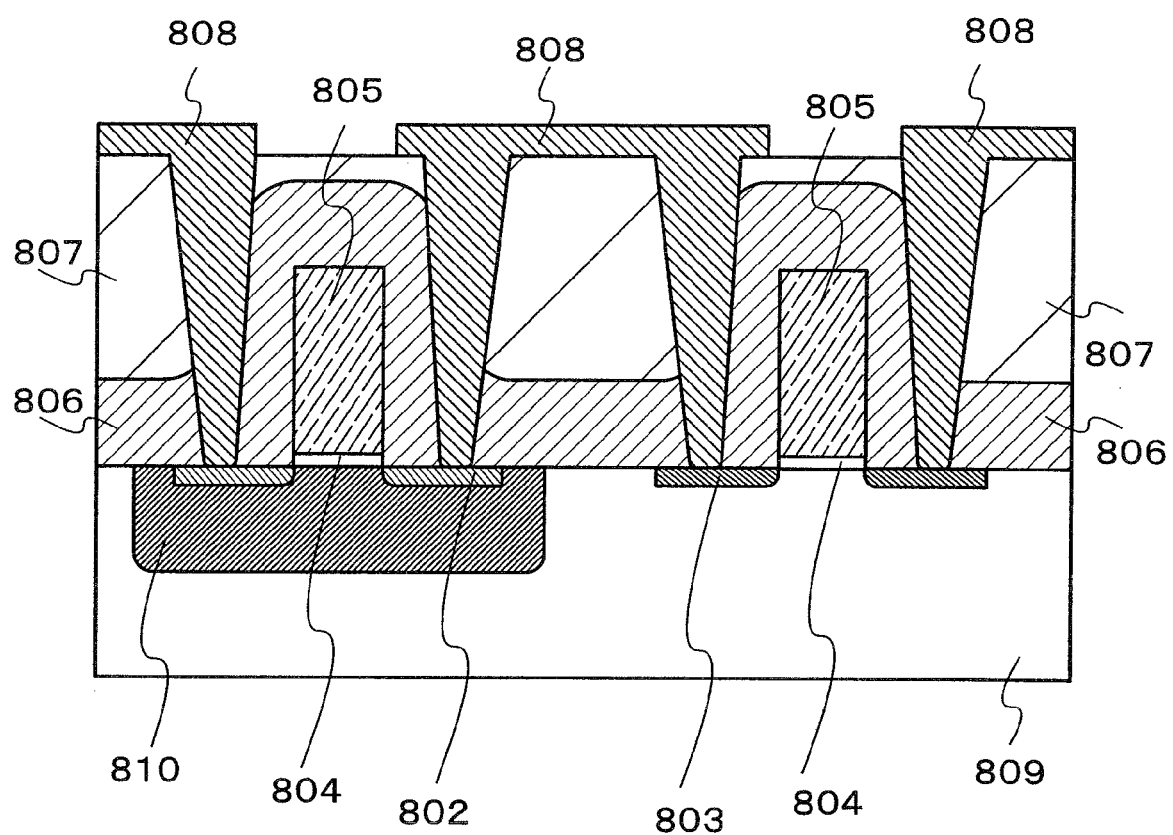
FIG. 19 is a cross sectional view illustrating a structure example of a conventional CMOS transistor.

FIG. 19 illustrates one example of a CMOS transistor using a conventional semiconductor substrate. The CMOS transistor includes an a substrate 809 having n-type conductivity, a well 810 having p-type conductivity, impurity regions 802 and 803, gate insulating layers 804, gate electrode layers 805, first insulating layers 806, second insulating layers 807, wirings 808, and the like. Active layers of the n-channel transistor and the p-channel transistor have the same crystal plane direction. Since the n-channel transistor and the p-channel transistor are not separated completely from each other in the conventional CMOS transistor, PNPN which is a parasitic thyristor structure is formed within the substrate of the conventional CMOS transistor. Accordingly, when an input voltage is input beyond the range of the power supply voltage, latch-up occurs. Latch-up is a malfunction mode peculiar to a CMOS transistor.

As crystal plane directions of the active layers of the n-channel transistor and the p-channel transistor, crystal plane directions by which mobility of carriers flowing through each channel is increased are employed, whereby high speed operation of the CMOS transistor of this embodiment mode can be achieved. Further, low voltage driving can be performed, and low power consumption can be achieved. Further, in the CMOS transistor of this embodiment mode, by the presence of the insulating region 701, formation of a well is not required, so that a process can be simplified. In addition, since a parasitic thyristor structure is not included within a substrate, latch-up can be suppressed.

This application is based on Japanese Patent Application serial no. 2007-298799 filed with Japan Patent Office on Nov. 19, 2007, the entire contents of which are hereby incorporated by reference.

What is claimed is:

1. A method for manufacturing a semiconductor device, comprising the steps of:
    preparing a plurality of first semiconductor substrates, wherein a side surface of each of the first semiconductor substrates has a first crystal plane direction;
    preparing a plurality of second semiconductor substrates, wherein a side surface of each of the second semiconductor substrates has a second crystal plane direction, which is different from the first crystal plane direction;
    forming a semiconductor ingot by bonding each of the first semiconductor substrates and each of the second semiconductor substrates alternately, wherein an upper surface of the semiconductor ingot comprises the side surfaces of the first semiconductor substrates having the first crystal plane direction and the side surfaces of the second semiconductor substrates having the second crystal plane direction alternately arranged in stripe;
    forming a third semiconductor substrate in which portions of the first semiconductor substrates and portions of the second semiconductor substrates are alternately arranged in stripe by slicing the semiconductor ingot parallel to the upper surface.

2. The method for manufacturing a semiconductor substrate, according to claim 1, wherein each of the first semiconductor substrates has a first conductivity type, and each of the second semiconductor substrates has a second conductivity type.

3. The method for manufacturing a semiconductor substrate, according to claim 1, wherein the semiconductor ingot has a quadratic prism shape.

4. The method for manufacturing a semiconductor substrate, according to claim 1, wherein the first crystal plane direction is {100}, and the second crystal plane direction is {110}.

5. The method for manufacturing a semiconductor substrate, according to claim 4, wherein each of the first semiconductor substrates is p-type, and each of the second semiconductor substrates is n-type.

6. A method for manufacturing a semiconductor device, comprising the steps of:
    preparing a plurality of first semiconductor substrates, wherein a side surface of each of the first semiconductor substrates has a first crystal plane direction;
    preparing a plurality of second semiconductor substrates, wherein a side surface of each of the second semiconductor substrates has a second crystal plane direction which is different from the first crystal plane direction;
    forming a semiconductor ingot by bonding each of the first semiconductor substrates and each of the second semiconductor substrates alternately, wherein an upper surface of the semiconductor ingot comprises the side surfaces of the first semiconductor substrates having the first crystal plane direction and the side surfaces of the second semiconductor substrates having the second crystal plane direction alternately arranged in stripe;
    forming a third semiconductor substrate in which portions of the first semiconductor substrates and portions of the second semiconductor substrates are alternately arranged in stripe by slicing the semiconductor ingot parallel to the upper surface;
    forming an embrittlement layer in the third semiconductor substrate by irradiating the third semiconductor substrate with an ion beam;
    superposing the third semiconductor substrate on an insulating substrate;
    performing heat treatment to the third semiconductor substrate and the insulating substrate to generate a crack at the embrittlement layer and separate a semiconductor layer over the insulating substrate from the third semiconductor substrate, thereby forming a semiconductor substrate in which a first semiconductor layer having the first crystal plane direction and a second semiconductor layer having the second crystal plane direction are alternately arranged in stripe over the insulating substrate;
    shaping the first semiconductor layer and the second semiconductor layer in the semiconductor substrate into a first active layer and a second active layer, respectively;
    forming a first thin film transistor using the first active layer; and
    forming a second thin film transistor using the second active layer.

7. The method for manufacturing a semiconductor device, according to claim 6, wherein the first thin film transistor has a first conductivity type, and the second thin film transistor has a second conductivity type.

8. The method for manufacturing a semiconductor substrate, according to claim 6, wherein the semiconductor ingot has a quadratic prism shape.

9. The method for manufacturing a semiconductor device, according to claim 6, wherein the first crystal plane direction is {100}, and the second crystal plane direction is {110}.

10. The semiconductor device according to claim 9, wherein the first thin film transistor is an n-channel thin film transistor, and the second thin film transistor is a p-channel thin film transistor.

11. The semiconductor device according to claim 10, wherein a crystal axis of a channel length direction of the first active layer in the first thin film transistor is <100>, and a crystal axis of a channel length direction of the second active layer in the second thin film transistor is <110>.

* * * * *